(12) United States Patent
Min

(10) Patent No.: US 11,469,386 B2
(45) Date of Patent: Oct. 11, 2022

(54) ORGANIC LIGHT EMITTING DISPLAY DEVICE INCLUDING FOLDING AREA WITH MULTI-COLORED OPENINGS

(71) Applicant: Samsung Display Co., Ltd., Yongin-Si (KR)

(72) Inventor: Myoung An Min, Cheonan-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 63 days.

(21) Appl. No.: 17/082,444

(22) Filed: Oct. 28, 2020

(65) Prior Publication Data

US 2021/0217976 A1    Jul. 15, 2021

(30) Foreign Application Priority Data

Jan. 13, 2020 (KR) .......... 10-2020-0004122

(51) Int. Cl.
| | | |
|---|---|---|
| *H01L 51/00* | (2006.01) | |
| *H01L 51/52* | (2006.01) | |
| *H01L 27/32* | (2006.01) | |
| *G09F 9/30* | (2006.01) | |

(52) U.S. Cl.
CPC .......... *H01L 51/0097* (2013.01); *G09F 9/301* (2013.01); *H01L 51/5246* (2013.01); *H01L 51/5253* (2013.01); *H01L 27/3248* (2013.01); *H01L 27/3274* (2013.01); *H01L 2251/5338* (2013.01); *H01L 2251/558* (2013.01)

(58) Field of Classification Search
CPC ............. H01L 51/0097; H01L 51/5246; H01L 51/5253; H01L 2251/5338; H01L 2251/558; H01L 27/3244; H01L 27/3248; H01L 27/3274; G09F 9/301
See application file for complete search history.

(56) References Cited

U.S. PATENT DOCUMENTS

| | | | |
|---|---|---|---|
| 9,356,087 B1* | 5/2016 | Lee ...................... | H01L 51/5237 |
| 10,873,043 B2* | 12/2020 | Jin ........................ | H01L 51/0097 |
| 11,048,295 B1* | 6/2021 | Smeeton ............... | G06F 1/1609 |
| 11,175,693 B2* | 11/2021 | Song ..................... | G09G 3/3208 |
| 2015/0049428 A1* | 2/2015 | Lee ......................... | G06F 1/1652 |
| | | | 361/679.27 |
| 2016/0218305 A1* | 7/2016 | Kim ....................... | G02F 1/1345 |
| 2018/0092166 A1* | 3/2018 | Kim ...................... | H01L 51/0097 |
| 2018/0175310 A1* | 6/2018 | Lee ......................... | B32B 27/08 |
| 2018/0192527 A1* | 7/2018 | Yun ........................ | G06F 1/1652 |

(Continued)

FOREIGN PATENT DOCUMENTS

| | | |
|---|---|---|
| KR | 1020160144912 A | 12/2016 |
| KR | 1020170080799 A | 7/2017 |

(Continued)

*Primary Examiner* — Ida M Soward
(74) *Attorney, Agent, or Firm* — Cantor Colburn LLP

(57) ABSTRACT

An organic light emitting display device includes a display panel, a support layer, a coating layer, and a cushion layer. The display panel includes a foldable area. The support layer is disposed on a bottom surface of the display panel, and a plurality of openings is defined through the support layer on the foldable area. The coating layer is disposed on a top surface of the support layer and side walls of the support member which define the openings. The cushion layer is disposed between the coating layer and the display panel.

20 Claims, 15 Drawing Sheets

(56) References Cited

U.S. PATENT DOCUMENTS

| | | | |
|---|---|---|---|
| 2019/0131553 A1* | 5/2019 | Park | H04M 1/0216 |
| 2019/0132987 A1* | 5/2019 | Koo | H05K 5/0217 |
| 2019/0243424 A1* | 8/2019 | Lee | G06F 1/1679 |
| 2020/0105168 A1* | 4/2020 | Choi | G06F 1/1656 |
| 2020/0152096 A1* | 5/2020 | Jia | H01L 51/5253 |
| 2020/0295282 A1* | 9/2020 | Xiang | H01L 27/3253 |
| 2021/0366319 A1* | 11/2021 | Feng | G06F 1/1675 |

FOREIGN PATENT DOCUMENTS

| | | |
|---|---|---|
| KR | 1020180036904 A | 4/2018 |
| KR | 1020180062272 A | 6/2018 |

\* cited by examiner

FIG. 2
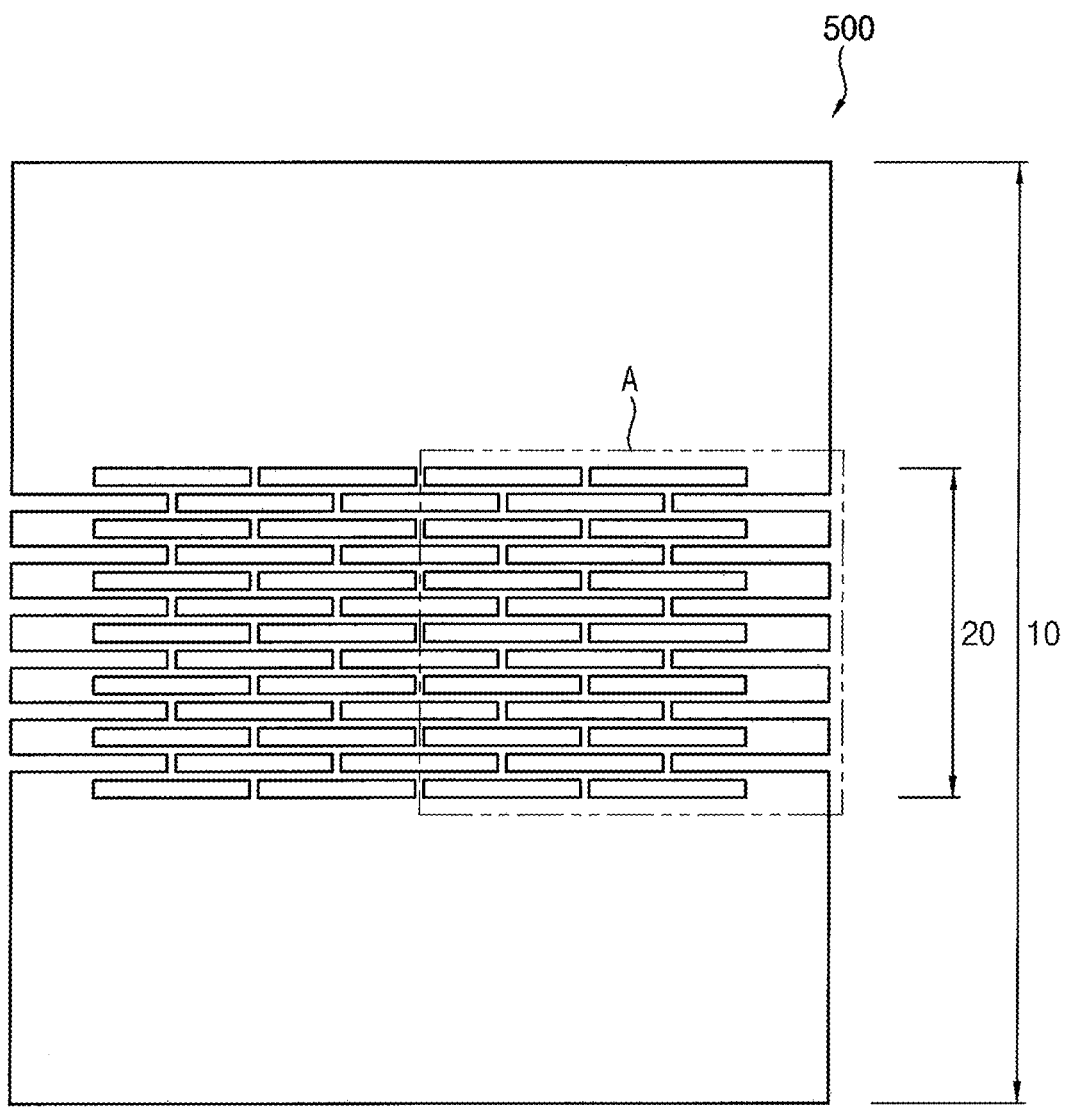
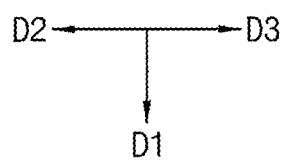

ORGANIC LIGHT EMITTING DISPLAY DEVICE INCLUDING FOLDING AREA WITH MULTI-COLORED OPENINGS

This application claims priority to Korean Patent Application No. 10-2020-0004122, filed on Jan. 13, 2020, and all the benefits accruing therefrom under 35 U.S.C. § 119, the content of which in its entirety is herein incorporated by reference.

BACKGROUND

1. Field

Embodiments relate generally to an organic light emitting display device. More particularly, embodiments of the invention relate to a flexible organic light emitting display device.

2. Description of the Related Art

Flat panel display devices are used as display devices due to lightweight and thin characteristics thereof. Such flat panel display devices may include a liquid crystal display device and an organic light emitting display device, for example.

Recently, a flexible organic light emitting display device has been developed in which a lower substrate and an upper substrate of a display panel included in the organic light emitting display may include a flexible material, and a part of the display panel may be bent or folded. In such a flexible organic light emitting display device, for example, the lower substrate included in the display panel may be formed of a polyimide substrate, and the upper substrate included in the display panel may have a thin film encapsulation structure. In addition, the flexible organic light emitting display device may display an image even in a portion where the display panel is folded. In other words, the flexible organic light emitting display device may include a display area for displaying the image, and a part of the display area may be folded.

SUMMARY

In a flexible organic light emitting display device where a part of the display area is folded, the flexible organic light emitting display device may further include a support member with a plurality of openings and disposed on a bottom surface of the display panel, and an adhesive member to bond the display panel to the support member. The openings of the support member may overlap the portion where the display panel is folded. However, while the flexible organic light emitting display is folded and unfolded, the adhesive member and the support member may be delaminated at the folded and unfolded portion, thereby causing defects in the flexible organic light emitting display device.

Embodiments provide a flexible display device.

According to an embodiment, an organic light emitting display device includes a display panel, a support member, a primer coating layer, and a shock absorbing member. In such an embodiment, the display panel includes a foldable area. In such an embodiment, the support member is disposed on a bottom surface of the display panel, and a plurality of openings is defined through the support member on the foldable area. In such an embodiment, the primer coating layer is disposed on a top surface of the support member and side walls of the support member which define the openings. In such an embodiment, the shock absorbing member is disposed between the primer coating layer and the display panel.

In an embodiment, the shock absorbing member may be disposed in each of the openings, and the shock absorbing member may be in direct contact with the primer coating layer.

In an embodiment, the shock absorbing member may be filled within the primer coating layer disposed on the side walls of the support member.

In an embodiment, the shock absorbing member may include a polyurethane foam.

In an embodiment, the primer coating layer may include polyisocyanate and polyol.

In an embodiment, the primer coating layer may have a thickness smaller than a thickness of the shock absorbing member.

In an embodiment, the organic light emitting display device may further include a first adhesive member disposed between the display panel and the shock absorbing member.

In an embodiment, a top surface of the first adhesive member may be in direct contact with the bottom surface of the display panel, and a bottom surface of the first adhesive member may be in direct contact with a top surface of the shock absorbing member.

In an embodiment, the display panel may further include a display area, and the foldable area may be defined by a part of the display area.

In an embodiment, the openings of the support member may include $1^{st}$ to $n^{th}$ openings arranged in a first direction parallel to a top surface of the display panel, where n is an integer of 1 or greater, and a $k^{th}$ opening among the $1^{st}$ to $n^{th}$ openings may be positioned while being shifted in a second direction orthogonal to the first direction, where k is an even number between 1 and n.

In an embodiment, the support member may further include a plurality of protrusions, each positioned in a third direction opposite to the second direction of corresponding two adjacent openings among the $1^{st}$ to $n^{th}$ openings, and the primer coating layer may be disposed on a top surface of each of the protrusions.

In an embodiment, a trench may be defined by a space between two adjacent protrusions among the protrusions, and the primer coating layer may be disposed on a side wall of the trench.

In an embodiment, the organic light emitting display device may further include a first step compensation member disposed on a first portion on a bottom surface of the support member and a second step compensation member disposed on a second portion opposite to the first portion of the bottom surface of the support member.

In an embodiment, the organic light emitting display device may further include an elastic member disposed on a bottom surface of the support member and a second adhesive member disposed between the support member and the elastic member.

In an embodiment, the second adhesive member may be in direct contact with the bottom surface of the support member and a top surface of the elastic member, and the second adhesive member may cover the openings.

In an embodiment, the primer coating layer and the shock absorbing member disposed in the openings may be in direct contact with the second adhesive member.

In an embodiment, the organic light emitting display device may further include a first metal member and a second metal member. In such an embodiment, the first metal member may be disposed on a first portion of a bottom surface of the elastic member, and the second metal member may be disposed on a second portion opposite to the first portion of the bottom surface of the elastic member, where the second metal member may be spaced apart from the first metal member.

In an embodiment, each of the first portion and the second portion may partially overlap the foldable area.

In an embodiment, the organic light emitting display device may further include a third adhesive member and a fourth adhesive member. In such an embodiment, the third adhesive member may be disposed between the first metal member and the elastic member, and the fourth adhesive member may be disposed between the second metal member and the elastic member, where the fourth adhesive member may be spaced apart from the third adhesive member.

In an embodiment, the display panel may include a first side surface and a second side surface opposite to the first side surface, and the first side surface and the second side surface of the display panel may be positioned adjacent to each other when the foldable area is folded.

Embodiments of the organic light emitting display device according to the invention may include the primer coating layer, so that the shock absorbing member may be bonded to the support member without the adhesive member. Accordingly, since the adhesive member is not included, the adhesive member and the support member may not be delaminated due to repeated folding and unfolding of a foldable area of the display panel, so that wrinkles may be effectively prevented from occurring on the display panel in the foldable area.

In such embodiments, the shock absorbing member fills the openings and the trenches, so that the support member positioned on the foldable area may not be cut off, and foreign substances or particles may be effectively prevented from permeating the openings and the trenches, even when the foldable area of the organic light emitting display device is repeatedly folded and unfolded.

In embodiments of the organic light emitting display device according to the invention, the shock absorbing member may be filled in the openings and the trenches, so that deformations of the openings and trenches may be prevented from exceeding an elastic limit. Accordingly, each width of the openings, each width of the protrusions, and each width of the trenches may be manufactured to be relatively large, and the precision etching process may not be performed.

Embodiments of the organic light emitting display device according to the invention may include the metal member, so that the display panel may be prevented from sagging in the foldable area, and static electricity, electromagnetic waves, electric fields, magnetic fields, and the like generated from the outside can be shielded.

In embodiments of the method of manufacturing the organic light emitting display device according to the invention, the primer coating layer instead of the adhesive member is formed on the support member, so that the adhesive strength between the support member and the shock absorbing member may be relatively increased. Accordingly, the adhesive member may be attached onto the shock absorbing member without the process of replacing the release paper. Thus, the manufacturing process steps of the organic light emitting display device may be reduced, and the manufacturing costs of the organic light emitting display device may be reduced.

BRIEF DESCRIPTION OF THE DRAWINGS

Exemplary embodiments can be understood in more detail from the following description taken in conjunction with the accompanying drawings, in which:

FIG. 2 is a plan view showing a support member included in the organic light emitting display of FIG. 1;

DETAILED DESCRIPTION

Figure 1:
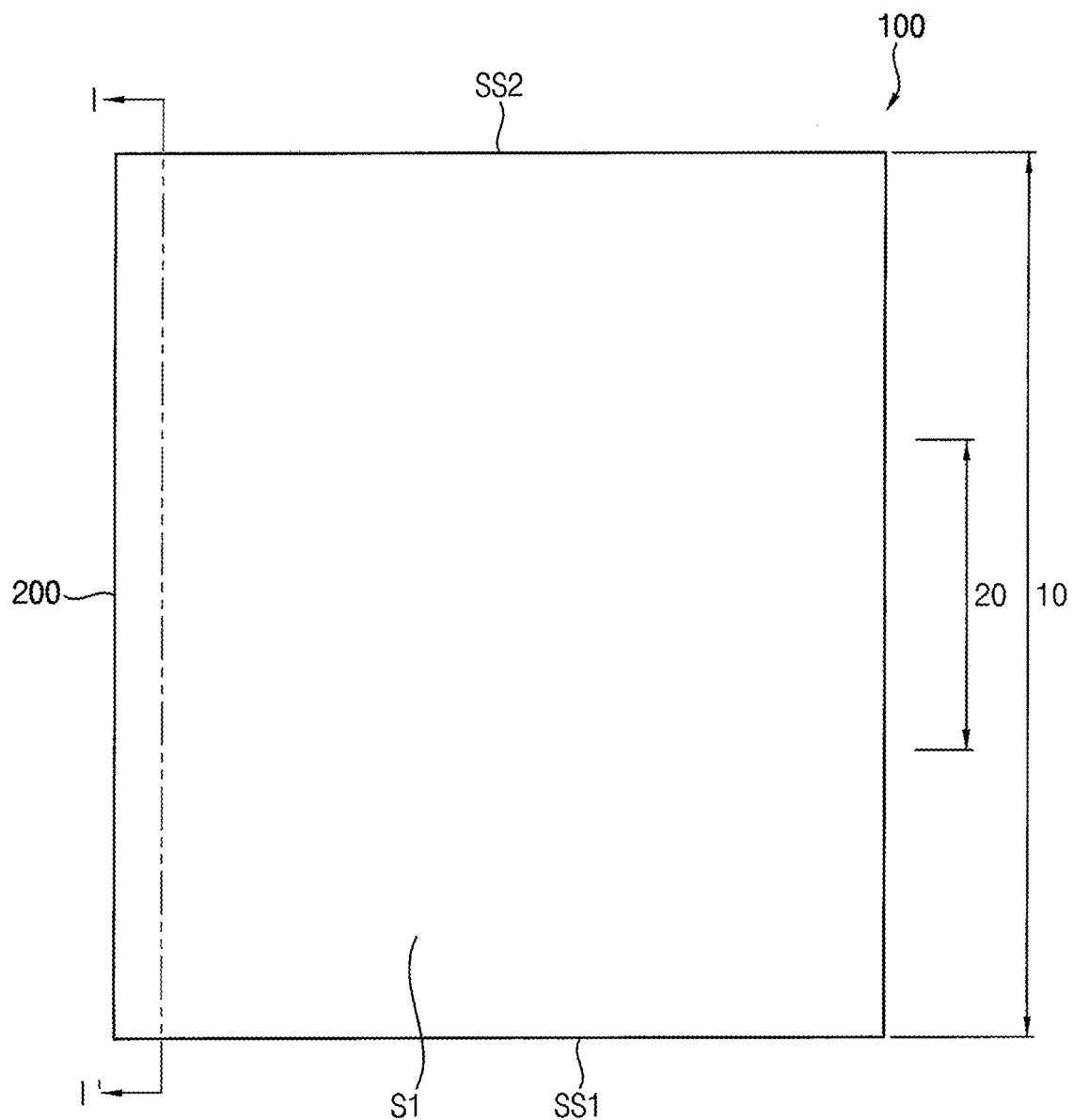
FIG. 1 is a plan view showing an organic light emitting display according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of an organic light emitting display device and a method of manufacturing an organic light emitting display device according to the invention will be described in detail with reference to the accompanying drawings.

Figure 3:
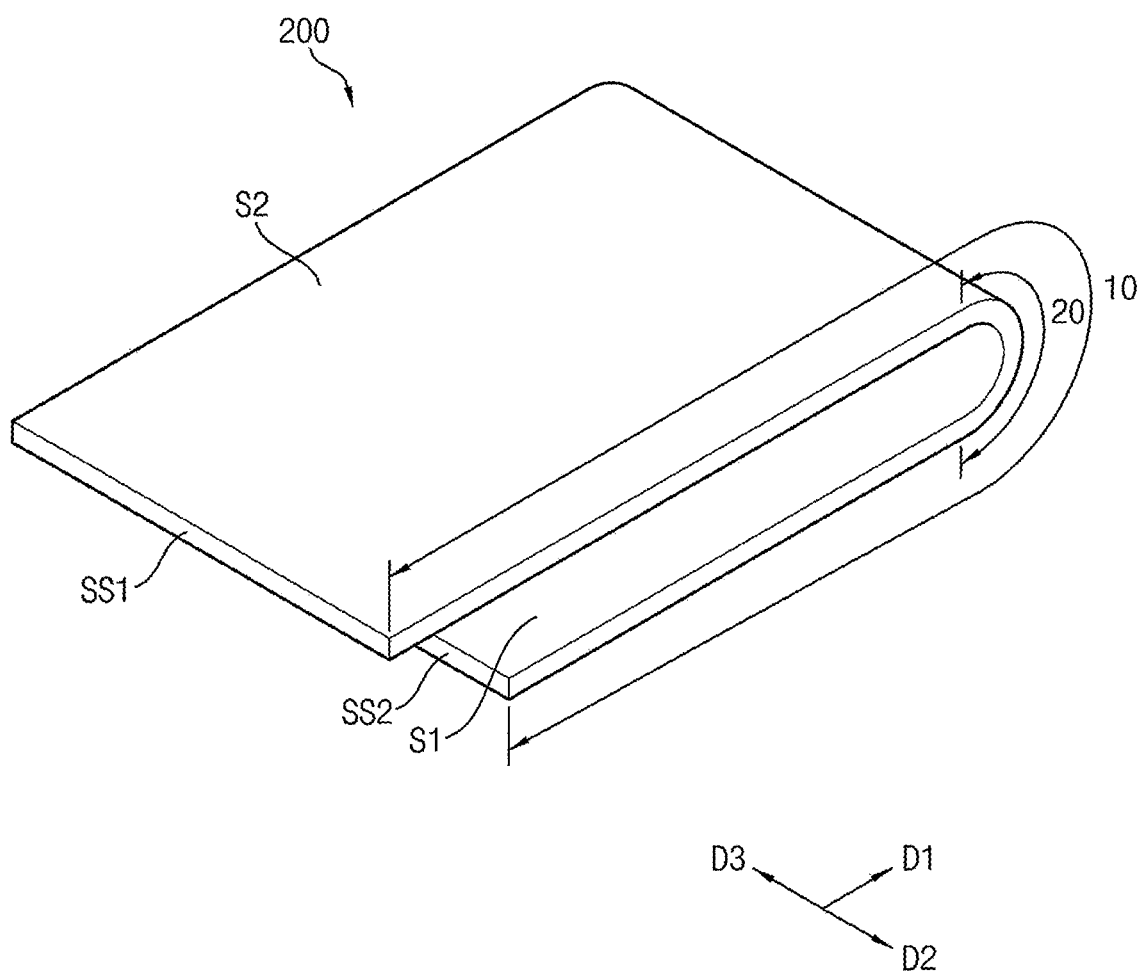
FIG. 3 is a perspective view showing a shape in which a display panel included in the organic light emitting display of FIG. 1 is folded.
Figure 4:
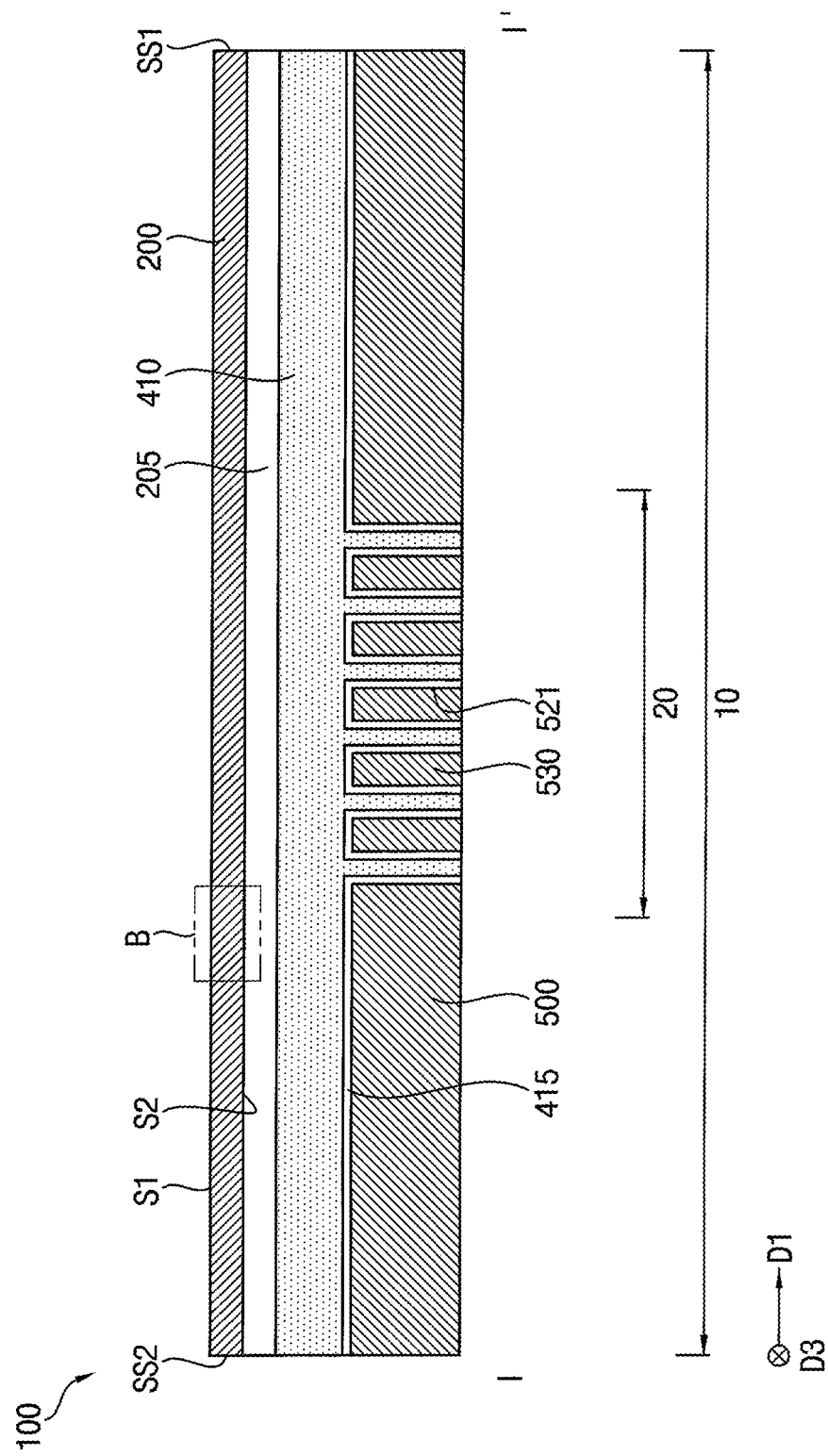
FIG. 4 is a cross-sectional view taken along line I-I' of FIG. 1.
Figure 5:
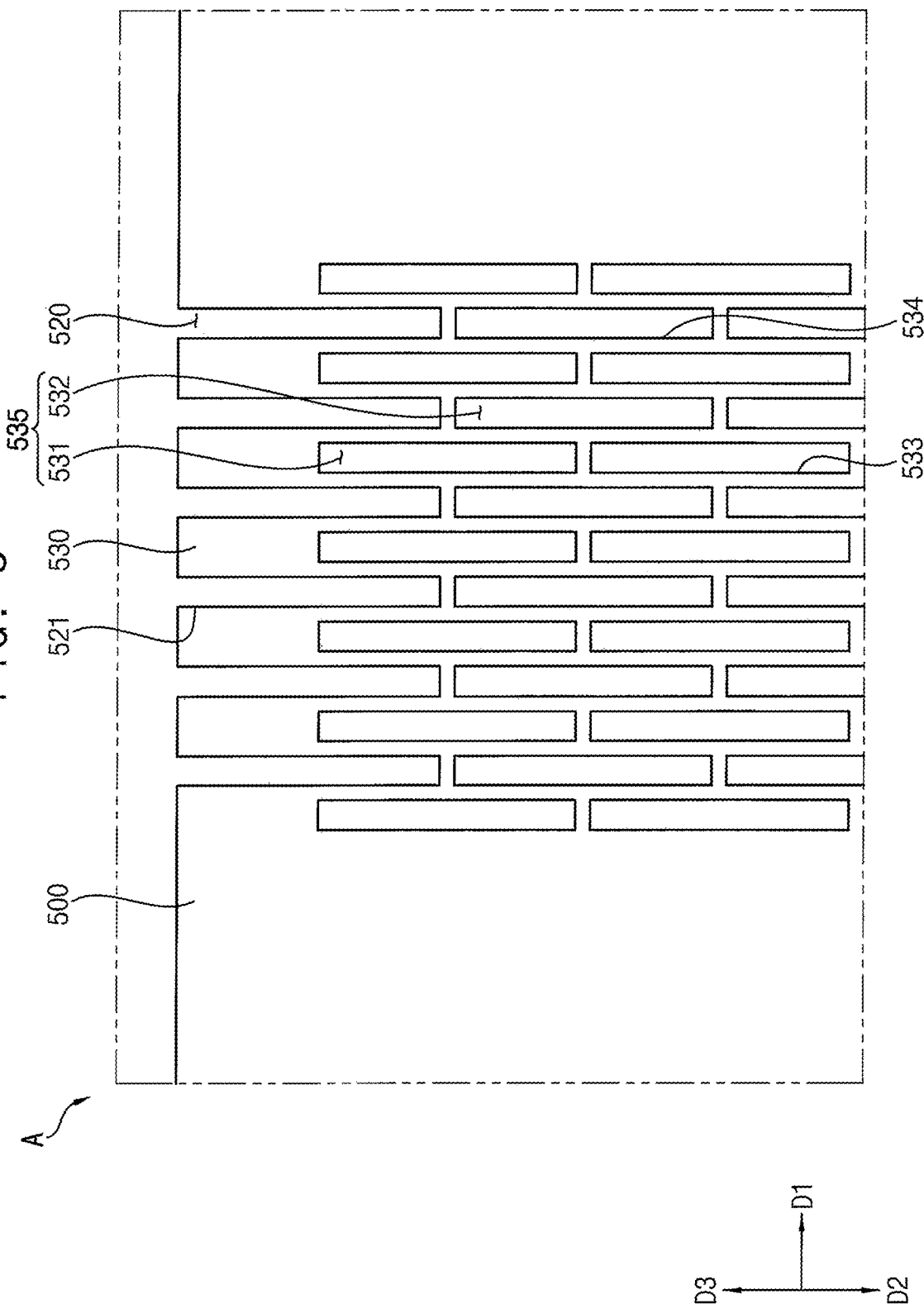
FIG. 5 is a partial enlarged plan view of an area 'A' of the organic light emitting display of FIG. 3.

FIG. 1 is a plan view showing an organic light emitting display according to an embodiment of the invention. FIG. 2 is a plan view showing a support member included in the organic light emitting display of FIG. 1. FIG. 3 is a perspective view showing a shape in which a display panel included in the organic light emitting display of FIG. 1 is folded, and FIG. 4 is a cross-sectional view taken along line I-I' of FIG. 1. FIG. 5 is a partial enlarged plan view of an area 'A' of the organic light emitting display of FIG. 3. More particularly, FIGS. 1 and 4 show an embodiment of the organic light emitting display device 100 in an unfolded state.

Referring to FIGS. 1, 2, 3, 4 and 5, an embodiment of the organic light emitting display device 100 may include a display panel 200, an adhesive member 205, a shock absorbing member 410 (e.g., a cushion layer 410), a primer coating layer 415 (e.g., a coating layer 415) and a support member 500 (e.g., a support layer 500). In an embodiment, as shown in FIG. 1, the organic light emitting display device 100 may include a display area 10 and a foldable area 20. The display area 10 is an area in which an image is displayed from the display panel 200, and the foldable area 20 is an area in which the organic light emitting display device 100 is folded or unfolded. In an embodiment, a part of the display area 10 may define the foldable area 20. In such an embodiment, the image may also be displayed in the foldable area 20. In an embodiment, as shown in FIGS. 2 and 5, a plurality of openings 535, a plurality of protrusions 530, and a plurality of trenches 520 may be defined or formed in the support member 500. In such an embodiment, a width of the foldable area 20 shown in FIGS. 1 and 2 in a first direction D1 parallel to a top surface of the organic light emitting display device 100 may be substantially narrower than those shown in FIGS. 1 and 2. In the drawings, the width is shown relatively wide for convenience of illustration and description.

In an embodiment of the organic light emitting display device 100, a display panel 200 may be provided. The display panel 200 may include a plurality of pixels, and may display an image through the pixels. In one embodiment, for example, the display panel 200 may have a first surface 51 on which the image is displayed and a second surface S2 opposite to the first surface 51. In an embodiment, the display panel 200 may have a first side surface SS1 and a second side surface SS2 opposite to (or facing) the first side surface SS1. As shown in FIG. 3, when the display panel 200 positioned in the foldable area 20 is folded (or in-folded), the first side surface SS1 and the second side surface SS2 may be positioned adjacent to each other. In an embodiment, the display panel 200 positioned in the foldable area 20 may have a curved shape. In such an embodiment, the first surface 51 may be positioned inside, and the second surface S2 may be positioned outside. In such an embodiment, the display panel 200 may be folded (or out-folded) such that the first surface 51 is positioned outside and the second surface S2 is positioned inside.

Referring to FIGS. 2, 4 and 5, in an embodiment of the organic light emitting display device 100, the support member 500 may be disposed on a bottom surface of the display panel 200. In such an embodiment, the support member 500 may be disposed on the second surface S2 of the display panel 200, and a plurality of openings 535 may be defined or formed through the support member 500 on the foldable area 20 or to overlap the foldable area 20. In an embodiment, the openings 535 may include openings 531 arranged in the first direction D1 parallel to the top surface of the organic light emitting display device 100, and openings 532 shifted in a second direction D2 orthogonal to the first direction D1 and arranged in the first direction D1. In such an embodiment, the support member 500 may further include a plurality of protrusions 530 protruding in a third direction D3 opposite to the second direction D2. In such an embodiment, a space between two adjacent protrusions among the protrusions 530 may define a trench 520.

In one embodiment, for example, the openings 535 may include $1^{st}$ to $n^{th}$ (where n is an integer of 2 or greater) openings arranged in the first direction D1, and a $k^{th}$ (where k is an even number between 1 and n) opening among the $1^{st}$ to $n^{th}$ openings may be shifted in the second direction orthogonal to the first direction. In such an embodiment, the support member 500 may further include protrusions positioned in the third direction D3 of the $(k-1)^{th}$ and $(k+1)^{th}$ openings among the $1^{st}$ to $n^{th}$ openings, and the trench may be defined by the protrusions.

The support member 500 may serve to support the display panel 200, and may also serve to enable the display panel 200 to be folded. In one embodiment, for example, the support member 500 may be disposed on the entire portion of the second surface S2 of the display panel 200 to support the display panel 200, and may prevent the display panel 200 positioned in the foldable area 20 from sagging due to the support member 500 and the protrusions 530 positioned between the openings 535 on the foldable area 20. In an embodiment, the openings 535 are defined or formed on the foldable area 20, so that the display panel 200 may be effectively folded in the foldable area 20.

In an embodiment of the organic light emitting display device 100, the primer coating layer 415 and the shock absorbing member 410 may be disposed in the openings 535. In one embodiment, for example, the primer coating layer 415 may be disposed on a side wall of the support member 500 which define the openings 535, and the shock absorbing member 410 may be filled on the primer coating layer 415 disposed on the side wall of the support member 500. In such an embodiment, the primer coating layer 415 may be coated relatively thinly on a top surface of the support member 500 and on a side wall 533 of each of the openings 531 and a side wall 534 of each of the openings 532 on the foldable area 20, and the shock absorbing member 410 may be disposed on the primer coating layer 415. In such an embodiment, the side wall of the support member 500 may be defined as the side wall 533 of each of the openings 531 and the side wall 534 of each of the openings 532.

In an embodiment, the primer coating layer 415 and the shock absorbing member 410 may also be disposed on a top surface of each of the protrusions 530 and a side wall 521 of each of the trenches 520. In one embodiment, for example, the primer coating layer 415 may be disposed on the side wall 521 of each of the trenches 520, and the shock absorbing member 410 may be filled on the primer coating layer 415 disposed on the side wall 521 of each of the trenches 520. In such an embodiment, the primer coating layer 415 may be relatively thinly coated on the top surface of each of the protrusions 530 and on the side wall 521 of each of the trenches 520 on the foldable area 20, and the shock absorbing member 410 may be disposed on the primer coating layer 415.

In an embodiment, when the organic light emitting display device 100 is folded, each shape of the openings 535 may be deformed. In one embodiment, for example, each of the openings 535 has a geometric shape, so that the support member 500 positioned on the foldable area 20 may not be deformed in a depth direction (for example, in a direction from the support member 500 to the display panel 200), but may be deformed in a longitudinal direction (for example, in the first direction D1).

The support member 500 may include a metal, a plastic or the like having relatively large elasticity or relatively large resilience. In one embodiment, for example, the support member 500 may include steel use stainless ("SUS"). In an embodiment, the support member 500 may include an alloy (for example, a super elastic metal) such as nickel-titanium (Ni—Ti), nickel-aluminum (Ni—Al), copper-zinc-nickel (Cu—Zn—Ni), copper-aluminum-nickel (Cu—Al—Ni), copper-aluminum-manganese (Cu—Al—Mn), titanium-nickel-copper-molybdenum (Ti—Ni—Cu—Mo), cobalt-nickel-gallium:iron (Co—Ni—Ga:Fe), silver-nickel (Ag—Ni), gold-cadmium (Au—Cd), iron-platinum (Fe—Pt), iron-nickel (Fe—Ni), and indium-cadmium (In—Cd).

In an embodiment, each of the openings 535 may have a rectangular plane shape, but the shape thereof is not limited thereto. In one alternative embodiment, for example, each of the openings 535 may have a triangular plane shape, a rhombus plane shape, a polygonal plane shape, a circular plane shape, a track plane shape, or an oval plane shape.

In an embodiment, the primer coating layer 415 may be disposed on the top surface of the support member 500 and the side walls of the support member 500 defined by openings 535 and the side wall of each of the trenches 520. In such an embodiment, the primer coating layer 415 may be coated with a relatively thin thickness along a profile of the top surface of the support member 500, and may be disposed on the entire portion of the support member 500. In an embodiment, a thickness of the primer coating layer 415 may be smaller than a thickness of the shock absorbing member 410. In one embodiment, for example, the thickness of the primer coating layer 415 may range from hundreds of nanometers to several angstroms. In such an embodiment, the primer coating layer 415 may have a thin film (or ultra-thin film) shape. In such an embodiment, where the primer coating layer 415 has the thin film shape, the primer coating layer 415 may not completely fill the openings 535 and the trenches 520 even when the primer coating layer 415 is disposed on the side walls (for example, the side wall of the support member 500 and the side wall of the trench 520). In such an embodiment, the shock absorbing member 410 is disposed in the openings 535 and the trench 520 on the primer coating layer 415, so that the shock absorbing member 410 may completely fill the openings 535 and the trench 520. In an embodiment, the primer coating layer 415 may have a relatively low molecular weight.

In an embodiment, the primer coating layer 415 may be disposed to improve the adhesion between the support member 500 and the shock absorbing member 410. The primer coating layer 415 may include at least one selected from a urethane-based primer coating layer, an acrylic-based primer coating layer, an acrylic-urethane-based primer coating layer and a vinyl-based coating layer, for example. In an embodiment, the primer coating layer 415 may be a urethane-based primer coating layer, and the primer coating layer 415 may include polyisocyanate, polyol, or the like. In one embodiment, for example, the shock absorbing member 410 includes a polyurethane ("PU"), and the primer coating layer 415 may include polyisocyanate, polyol or the like that are constituent materials of PU. In such an embodiment, constituent materials of the primer coating layer 415 may be determined based on or selected from constituent materials of the shock absorbing member 410.

In an alternative embodiment, a thin film layer may be formed on the top surface of the support member 500 or the roughness of the top surface of the support member 500 may be changed by performing a plasma treatment process, an anodizing treatment process, a polishing treatment process, or the like on the top surface of the support member 500 instead of the primer coating layer 415. The adhesive strength between the support member 500 and the shock absorbing member 410 may be improved through the above schemes.

In an embodiment, the shock absorbing member 410 may be disposed on the primer coating layer 415. In such an embodiment, the shock absorbing member 410 may be interposed between the primer coating layer 415 and the display panel 200, and may be disposed on the entire portion of the primer coating layer 415. In an embodiment, the shock absorbing member 410 may be disposed in each of the openings 535, and may be in direct contact with the primer coating layer 415. In one embodiment, for example, the shock absorbing member 410 may be filled within the primer coating layer 415 disposed on the side walls of the support member 500. In an embodiment, the shock absorbing member 410 may be disposed on the trenches 520 and the top surface of each of the protrusions 530, and the shock absorbing member 410 may be filled within the primer coating layer 415 disposed on each side wall of the trenches 520. In such an embodiment, where the shock absorbing member 410 is filled in the openings 535 and the trenches 520, deformations of the openings 535 and trenches 520 may be effectively prevented from exceeding an elastic limit, and foreign substances or particles may be effectively prevented from permeating the openings 535 and the trenches 520.

In an embodiment, the shock absorbing member 410 may protect the display panel 200 from an external shock. In such an embodiment, the shock absorbing member 410 may include a ductile material to enable the display panel 200 to be easily folded. In one embodiment, for example, the shock absorbing member 410 may include PU, polystyrene ("PS") or the like. In an embodiment, the shock absorbing member 410 may include a foam-type material such as PU foam.

The adhesive member 205 may be disposed between the display panel 200 and the shock absorbing member 410. In an embodiment, a top surface of the adhesive member 205 may be in direct contact with the bottom surface of the display panel 200, and a bottom surface of the adhesive member 205 may be in direct contact with a top surface of the shock absorbing member 410. In an embodiment, the adhesive member 205 may bond the display panel 200 to the shock absorbing member 410. The adhesive member 205 may include at least one selected from an optical clear adhesive ("OCA"), a pressure sensitive adhesive ("PSA") and photocurable or thermosetting resin, for example. In one embodiment, for example, the adhesive may include at least one selected from polyethylene terephthalate ("PET"), polyethylene naphthalene ("PEN"), polypropylene ("PP"), polycarbonate ("PC"), PS, polysulfone ("Psul"), polyethylene ("PE"), polyphthalamide ("PPA"), polyethersulfone ("PES"), polyarylate ("PAR"), polycarbonate oxide ("PCO") and modified polyphenylene oxide ("MPPO"). The resin of the adhesive member 205 may include epoxy resin, amino resin, phenol resin, urea resin, melamine resin, unsaturated polyester resin, PU resin, polyimide resin, and the like.

In a conventional organic light emitting display device, the shock absorbing member 410 may bonded to the support member 500 through an adhesive member. In such a conventional organic light emitting display device, the adhesive member may not be disposed in the openings 535, and the openings 535 may exist as empty spaces. When the foldable area 20 of the conventional organic light emitting display device is repeatedly folded and unfolded, portions of the adhesive member and the support member 500 on the foldable area 20 may be delaminated, thereby causing wrinkles in the foldable area 20 on the display panel 200. In addition, when the openings 535 exist as empty spaces, foreign substances may permeate the openings 535 or a part of particles generated during forming the openings 535 of the support member 500 positioned on the foldable area 20 may be separated from the support member 500 and positioned in the openings 535. The foreign substances and the particles may not escape out of the openings 535. Accordingly, in such a conventional organic light emitting display device, the support member 500 positioned on the foldable area 20 may be damaged or the shape of the openings 535 may be deformed due to the foreign substances and the particles such that defects of the conventional organic light emitting display device may be caused in the foldable area 20.

An embodiment of the organic light emitting display device 100 according to the invention may include the primer coating layer 415, so that the shock absorbing member 410 may be bonded to the support member 500 without the adhesive member. Accordingly, since the adhesive member is not included, the adhesive member and the support member 500 may not be delaminated, so that wrinkles may be prevented from occurring on the display panel 200 positioned in the foldable area 20.

In such an embodiment, the shock absorbing member 410 fills the openings 535 and the trenches 520, so that the support member 500 positioned on the foldable area 20 may not be cut off, and foreign substances or particles may be effectively prevented from permeating the openings 535 and the trenches 520, even when the foldable area 20 of the organic light emitting display device 100 is repeatedly folded and unfolded.

Figure 6:
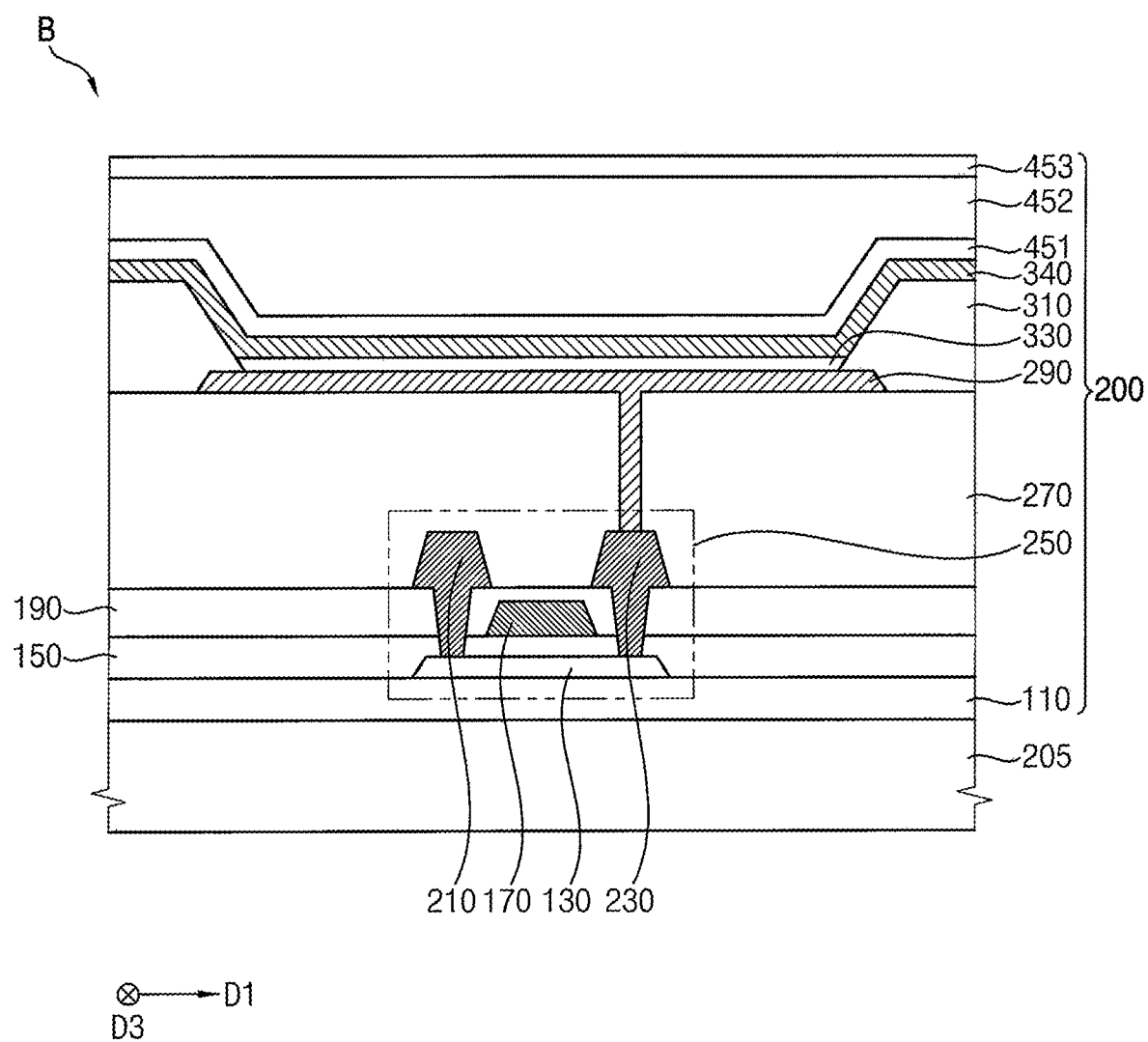
FIG. 6 is a partial enlarged sectional view of an area 'B' of the organic light emitting display device of FIG. 4.

FIG. 6 is a partial enlarged sectional view of an area 'B' of the organic light emitting display device of FIG. 4.

Referring to FIG. 6, an embodiment of the display panel 200 may include a substrate 110, a semiconductor element 250, a planarization layer 270, a lower electrode 290, a pixel defining layer 310, a light emitting layer 330, an upper electrode 340, a first inorganic thin film encapsulation layer 451, an organic thin film encapsulation layer 452, a second inorganic thin film encapsulation layer 453, or the like. In such an embodiment, the semiconductor element 250 may include the active layer 130, the gate insulating layer 150, the gate electrode 170, the insulating interlayer 190, the source electrode 210 and the drain electrode 230.

In an embodiment of the display panel 200, the substrate 110, which includes a transparent or opaque material, may be provided. The substrate 110 may be disposed on the adhesive member 205. The substrate 110 may include or be formed of a transparent resin substrate. In one embodiment, for example, the transparent resin substrate may include a polyimide substrate. In casein such an embodiment, the polyimide substrate may include a first polyimide layer, a barrier film layer, a second polyimide layer, and the like. In an alternative embodiment, the substrate 110 may include a quartz substrate, a synthetic quartz substrate, a calcium fluoride substrate, a fluorine-doped (F-doped) quartz substrate, a soda-lime glass substrate, a non-alkali glass substrate, or the like.

In an embodiment of the display panel 200, the buffer layer may be disposed on the substrate 110. The buffer layer may prevent metal atoms or impurities from diffusing from the substrate 110 to the semiconductor element 250, and may enable a substantially uniform active layer to be obtained by adjusting the rate of heat transfer during a crystallization process for forming the active layer. In an embodiment, where a surface of the substrate 115 is not uniform, the buffer layer may serve to improve the flatness of the surface of the substrate 110. Alternatively, at least two buffer layers may be provided on the substrate 110, or the buffer layer may be omitted, based on a type of the substrate 100. In one embodiment, for example, the buffer layer may include an organic material or an inorganic material.

In an embodiment of the display panel 200, the active layer 130 may be disposed on the substrate 110. The active layer 130 may include a metal oxide semiconductor, an inorganic semiconductor (such as amorphous silicon and poly silicon), an organic semiconductor, or the like. The active layer 130 may have source and drain areas.

In such an embodiment, the gate insulating layer 150 may be disposed on the active layer 130. In one embodiment, for example, the gate insulating layer 150 may sufficiently cover the active layer 130 on the substrate 110, and may have a substantially planar upper surface without generating a step around the active layer 130. Alternatively, the gate insulating layer 150 may be disposed to have a uniform thickness along a profile of the active layer 130 while covering the active layer 130 on the substrate 110. The gate insulating layer 150 may include a silicon compounds, a metal oxide, or the like. In one embodiment, for example, the gate insulating layer 150 may include at least one selected from silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO) and titanium oxide (TiO). In an embodiment, the gate insulating layer 150 may have a multi-layer structure including a plurality of insulating layers. In one embodiment, for example, the insulating layers may have different thicknesses or include different materials from each other.

In an embodiment of the display panel 200, the gate electrode 170 may be disposed on the gate insulating layer 150. The gate electrode 170 may be disposed on a portion of the gate insulating layer 150 below which the active layer 130 is positioned. The gate electrode 170 may include a metal, an alloy, a metal nitride, a conductive metal oxide, a transparent conductive material, or the like. In one embodiment, for example, the gate electrode 170 may include at least one selected from gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy containing aluminum, aluminum nitride (AlN), an alloy containing silver, tungsten nitride (WN), an alloy containing copper, an alloy containing molybdenum, titanium nitride (TiN), chromium nitride (CrN), tantalum nitride (TaN), strontium ruthenium oxide (SrRuO), zinc oxide (ZnO), indium tin oxide ("ITO"), tin oxide (SnO), indium oxide (InO), gallium oxide (GaO) and indium zinc oxide ("IZO"). These materials may be used individually or in combination. In an embodiment, the gate electrode 170 may include a multi-layer structure including a plurality of metal layers. In one embodiment, for example, the metal layers may have different thicknesses or include different materials from each other.

In an embodiment of the display panel 200, an insulating interlayer 190 may be disposed on the gate electrode 170. In one embodiment, for example, the insulating interlayer 190 may sufficiently cover the gate electrode 170 on the gate insulating layer 150, and may have a substantially planar upper surface without generating a step around the gate electrode 170. Alternatively, the insulating interlayer 190 be disposed to have a uniform thickness along a profile of the gate electrode 170 while covering the gate electrode 170 on the gate insulating layer 150. The insulating interlayer 190 may include a silicon compounds, a metal oxide, or the like. In an embodiment, the insulating interlayer 190 may have a multi-layer structure including a plurality of insulating layers. In one embodiment, for example, the insulating layers may have different thicknesses or include different materials from each other.

The source electrode 210 and the drain electrode 230 may be disposed on the insulating interlayer 190. The source electrode 210 may be connected to a source area of the active layer 130 through a first contact hole formed by removing a first portion of the gate insulating layer 150 and the insulating interlayer 190, and the drain electrode 230 may be connected to the drain area of the active layer 130 through a contact hole formed by removing second portions of the gate insulating layer 150 and the insulating interlayer 190. Each of the source electrode 210 and the drain electrode 230 may include at least one selected from a metal, an alloy, a metal nitride, a conductive metal oxide and a transparent conductive material, for example. These materials may be used individually or in combination. In an embodiment, each of the source electrode 210 and the drain electrode 230 may have a multi-layer structure including a plurality of metal layers. In one embodiment, for example, the metal layers may have different thicknesses or include different materials from each other.

Accordingly, a semiconductor element 250 including the active layer 130, the gate insulating layer 150, the gate electrode 170, the insulating interlayer 190, the source electrode 210, and the drain electrode 230 may be disposed on the substrate 110.

In an embodiment, the semiconductor element 250 may have an upper gate structure, but the invention is not limited thereto. In one alternative embodiment, for example, the semiconductor element 250 may have a bottom gate structure, a double gate structure, or the like.

In an embodiment, the organic light emitting display device 100 may include a single semiconductor element for each pixel thereof, but the invention is not limited thereto. In one alternative embodiment, for example, each pixel of the organic light emitting display device 100 may include at least one semiconductor element and at least one storage capacitor.

The planarization layer 270 may be disposed on the insulating interlayer 190, the source electrode 210, and the drain electrode 230. In one embodiment, for example, the planarization layer 270 may be relatively thickly arranged or have a thickness greater than a predetermined thickness, which is determined to provide a planarized surface on the insulating interlayer 190, the source electrode 210, and the drain electrode 230. In such an embodiment, the planarization layer 270 may have a substantially planar top surface, and a planarization process may be additionally performed to the planarization layer 270 to implement the planar upper surface of the planarization layer 270. In an alternative embodiment, the planarization layer 270 may be disposed to have a uniform thickness along profiles of the source electrode 210 and the drain electrode 230 on the insulating interlayer 190. The planarization layer 270 may include or be formed of an organic material or an inorganic material. In an embodiment, the planarization layer 270 may include an organic material. In one embodiment, for example, the planarization layer 270 may include at least one selected from photoresist, polyacryl-based resin, polyimide-based resin, polyamide-based resin, siloxane-based resin, acryl-based resin and epoxy-based resin.

The lower electrode 290 may be disposed on the planarization layer 270. The lower electrode 290 may be connected to the drain electrode 230 through a contact hole formed by removing a part of the planarization layer 270. The lower electrode 290 may be electrically connected to the semiconductor element 250. The lower electrode 290 may include at least one selected from a metal, an alloy, a metal nitride, a conductive metal oxide, and a transparent conductive material, for example. These materials may be used individually or in combination. In an embodiment, the lower electrode 290 may have a multi-layer structure including a plurality of metal layers. In one embodiment, for example, the metal layers may have different thicknesses or include different materials from each other.

The pixel defining layer 310 may be disposed on the planarization layer 270. In one embodiment, for example, the pixel defining layer 310 may expose a part of the top surface of the lower electrode 290 while covering opposing sides of the lower electrode 290. The pixel defining layer 310 may include or be formed of an organic material or an inorganic material. In one embodiment, for example, the pixel defining layer 310 may include an organic material.

The light emitting layer 330 may be disposed on the pixel defining layer 310 and the lower electrode 290. In an embodiment, the light emitting layer 330 may include or be formed using at least one of light emitting materials capable of emitting color lights (such as red light, green light, and blue light) that are corresponding to each pixel. In an alternative embodiment, the light emitting layer 330 may be defined by, or formed by laminating, a plurality of light emitting materials capable of generating different color light such as red light, green light and blue light, such that white light may be emitted from the light emitting layer 330. In such an embodiment, a color filter may be disposed on the light emitting layer 330 disposed on the lower electrode 290. The color filter may include at least one selected from a red color filter, a green color filter, and a blue color filter. Alternatively, the color filter may include a yellow color filter, a cyan color filter, and a magenta color filter. The color filter may include photosensitive resin or color photoresist.

The upper electrode 340 may be disposed on the light emitting layer 330 and the pixel defining layer 310. The upper electrode 340 may include at least one selected from a metal, an alloy, a metal nitride, a conductive metal oxide, and a transparent conductive material, for example. These materials may be used individually or in combination. In an embodiment, the upper electrode 340 may have a multi-layer structure including a plurality of layers. In one embodiment, for example, the metal layers may have different thicknesses or include different materials from each other.

The first inorganic thin film encapsulation layer 451 may be disposed on the upper electrode 340. The first inorganic thin film encapsulation layer 451 may be disposed to have a uniform thickness along a profile of the upper electrode 340 while covering the upper electrode 340. In an embodiment, the first inorganic thin film encapsulation layer 451 may prevent the light emitting layer 330 from deteriorating due to the permeation of the moisture, oxygen, or the like. In such an embodiment, the first inorganic thin film encapsulation layer 451 may also function to protect the display panel 200 from the external impact. The first inorganic thin film encapsulation layer 451 may include a flexible inorganic material.

The organic thin film encapsulation layer 452 may be disposed on the first inorganic thin film encapsulation layer 451. The organic thin film encapsulation layer 452 may improve the flatness of the display panel 200, and may protect the display panel 200. The organic thin film encapsulation layer 452 may include a flexible organic material.

The second inorganic thin film encapsulation layer 453 may be disposed on the organic thin film encapsulation layer 452. The second inorganic thin film encapsulation layer 453 may be disposed to have a uniform thickness along the profile of the organic thin film encapsulation layer 452 while covering the organic thin film encapsulation layer 452. The second inorganic thin film encapsulation layer 453 together with the first inorganic thin film encapsulation layer 451 may prevent the light emitting layer 330 from deteriorating due to the permeation of the moisture, oxygen, or the like. In addition, the second inorganic thin film encapsulation layer 453 may also function to protect the display panel 200 from the external impact, together with the first inorganic thin film encapsulation layer 451 and the organic thin film encapsulation layer 452. The second inorganic thin film encapsulation layer 453 may include a flexible inorganic material.

Accordingly, the display panel 200, which includes the substrate 110, the semiconductor element 250, the planarization layer 270, the lower electrode 290, the pixel defining layer 310, the light emitting layer 330, the upper electrode 340, the first inorganic thin film encapsulation layer 451, the organic thin film encapsulation layer 452, and the second inorganic thin film encapsulation layer 453, may be defined or provided as described above.

FIGS. 7 to 13 are cross-sectional views showing a method of manufacturing an organic light emitting display device according to an embodiment of the invention.

Figure 7:
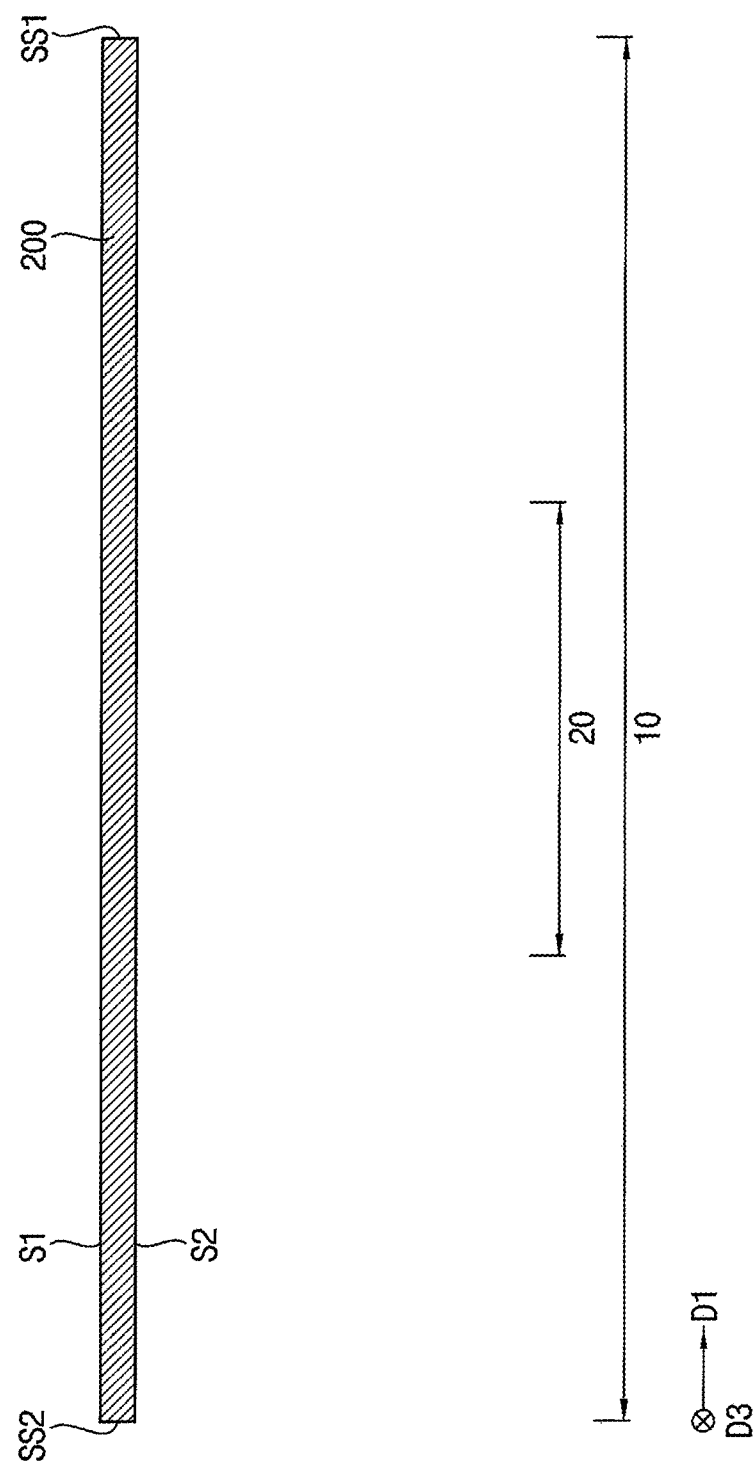
FIGS. 7 to 13 are cross-sectional views showing a method of manufacturing an organic light emitting display device according to an embodiment of the invention.

Referring to FIG. 7, in an embodiment of a method of manufacturing an organic light emitting display device, a display panel 200 may be provided. The display panel 200 may include a plurality of pixels, and may display an image through the pixels. In one embodiment, for example, the display panel 200 may have a first surface S1 on which the image is displayed and a second surface S2 opposite to the first surface S1. In such an embodiment, the display panel 200 may have a first side surface SS1 and a second side surface SS2 opposite to the first side surface SS1. In such an embodiment, the display panel 200 may include a display area 10 and a foldable area 20. The display area 10 is an area where an image is displayed from the display panel 200, and the foldable area 20 is an area where the display panel 200 is folded or unfolded. A part of the display area 10 may define the foldable area 20. In such an embodiment, the image may also be displayed in the foldable area 20.

Figure 8:
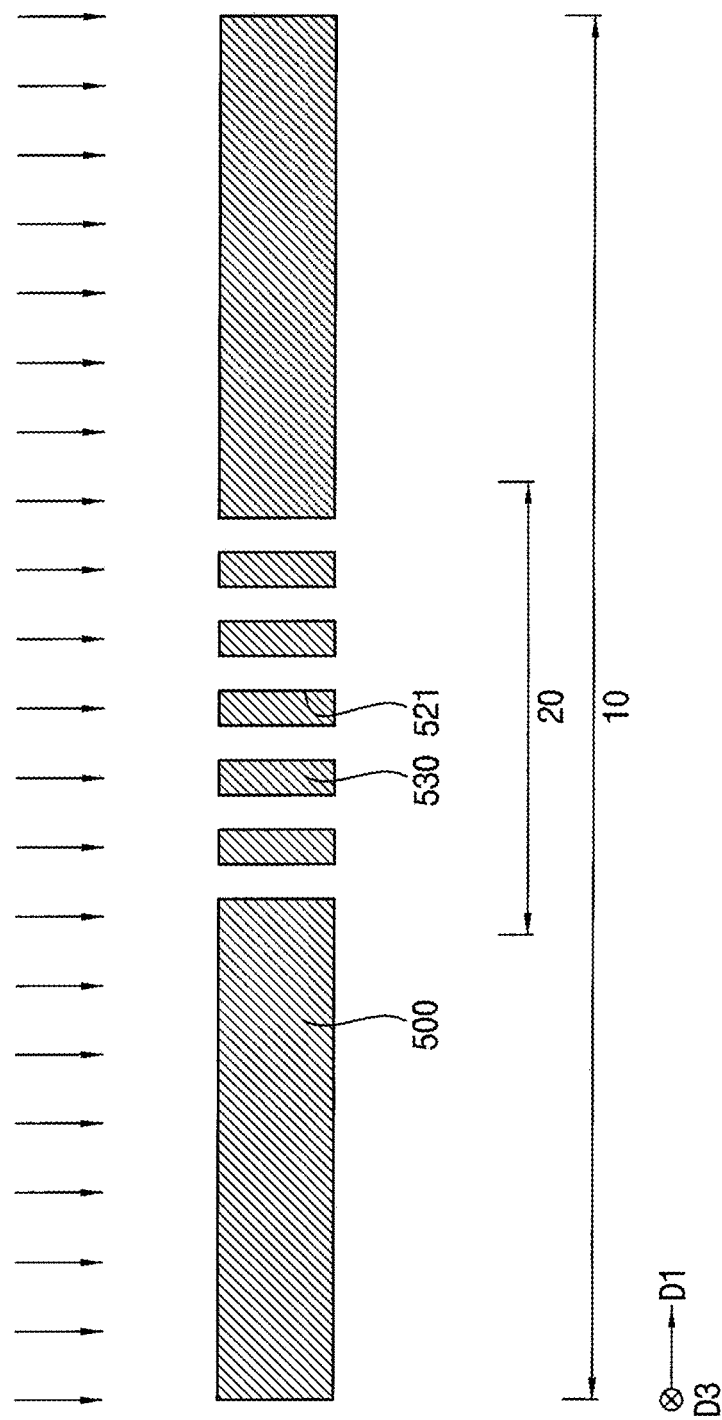

Referring to FIGS. 2, 5 and 8, in an embodiment of a method of manufacturing an organic light emitting display device, a support member 500 may be provided. In such an embodiment, a plurality of openings 535 may be formed through the support member 500 on the foldable area 20. In an embodiment, the openings 535 may include openings 531 arranged in the first direction D1 and openings 532 shifted in a second direction D2 orthogonal to the first direction D1 and arranged in the first direction D1. In such an embodiment, the support member 500 may further include a plurality of protrusions 530 protruding in the third direction D3. In such an embodiment, a space between two adjacent protrusions among the protrusions 530 may define a trench 520.

The support member 500 may include a metal, a plastic or the like having relatively large elasticity or relatively large resilience. In an embodiment, the support member 500 may be manufactured using SUS. Alternatively, the support member 500 may be manufactured using an alloy such as Ni—Ti, Ni—Al, Cu—Zn—Ni, Cu—Al—Ni, Cu—Al—Mn, Ti—Ni—Cu—Mo, Co—Ni—Ga:Fe, Ag—Ni, Au—Cd, Fe—Pt, Fe—Ni and In—Cd, for example.

After the support member 500 is provided, a polyurethane coating solution may be sprayed on the entire portion of an upper side of the support member 500. In one embodiment, for example, the polyurethane coating solution may be prepared using polyisocyanate, polyol, or the like.

Figure 9:
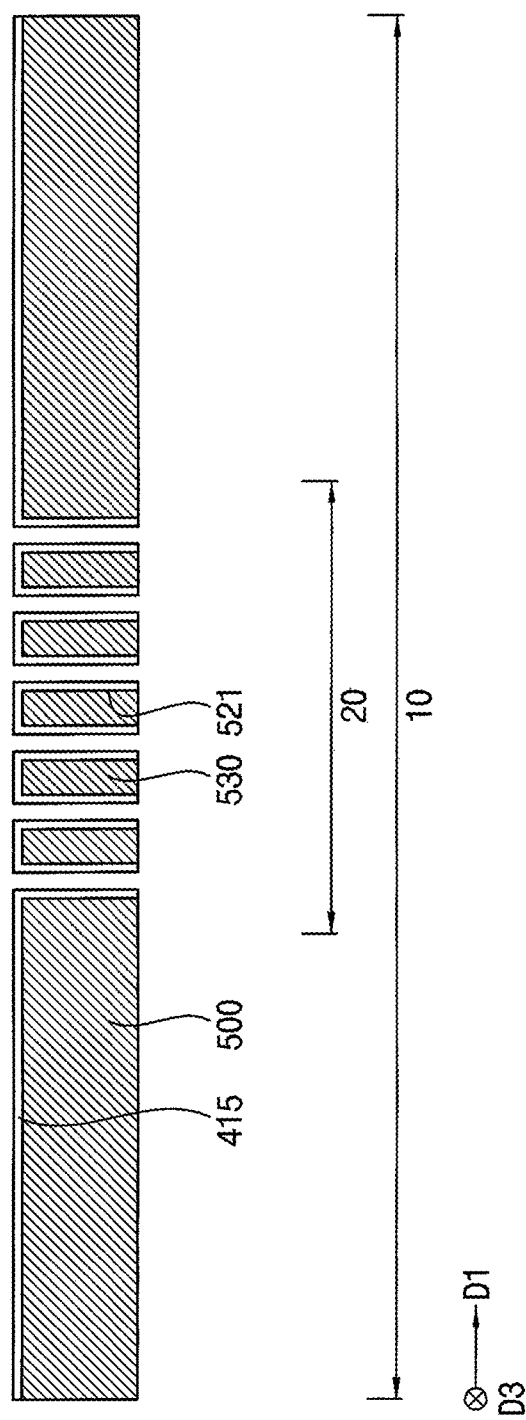

Referring to FIGS. 5 and 9, after the polyurethane coating solution is sprayed, a primer coating layer 415 may be formed on the support member 500. In one embodiment, for example, the primer coating layer 415 may be coated with a relatively thin thickness along a profile of the top surface of the support member 500, and may be disposed on the entire upper portion and inner side portion of the support member 500.

In an embodiment, the primer coating layer 415 may be formed on a side wall of the support member 500 which define the openings 535. In such an embodiment, the primer coating layer 415 may be coated relatively thinly on a top surface of the support member 500 and on a side wall 533 of each of the openings 531 and a side wall 534 of each of the openings 532 on the foldable area 20. In such an embodiment, the side walls of the support member 500 that define the openings 531 and 532 may be defined as the side wall 533 of each of the openings 531 and the side wall 534 of each of the openings 532. Herein, such side walls of the support member 500 may be inner side surfaces of the support member 500, which are inner surfaces substantially parallel to a thickness direction of the support member 500.

In an embodiment, the primer coating layer 415 may also be provided or formed on a top surface of each of the protrusions 530 and a side wall 521 of each of the trenches 520. In one embodiment, for example, the primer coating layer 415 may be disposed on the side wall 521 of each of the trenches 520. In such an embodiment, the primer coating layer 415 may be relatively thinly coated on the top surface of each of the protrusions 530 and on the side wall 521 of each of the trenches 520 on the foldable area 20.

The thickness of the primer coating layer 415 may be in a range from hundreds of nanometers to several angstroms. In an embodiment, the primer coating layer 415 may have a thin film shape. Since the primer coating layer 415 has the thin film shape, each of the openings 535 and the trenches 520 may not be completely filled even when the primer coating layer 415 is disposed on the side walls. In such an embodiment, the primer coating layer 415 may have a relatively low molecular weight.

The primer coating layer 415 may include at least one selected from a urethane-based primer coating layer, an acrylic-based primer coating layer, an acrylic-urethane-based primer coating layer and a vinyl-based coating layer, for example. In an embodiment, the primer coating layer 415 may be a urethane-based primer coating layer, and the polyurethane coating solution may be prepared using polyisocyanate, polyol or the like so that the primer coating layer 415 may also include polyisocyanate, polyol, or the like.

In an alternative embodiment, a thin film layer may be formed on the top surface of the support member 500 or the roughness of the top surface of the support member 500 may be changed by performing a plasma treatment process, an anodizing treatment process, a polishing treatment process, or the like on the top surface of the support member 500 instead of the process of spraying the polyurethane coating solution.

Figure 10:
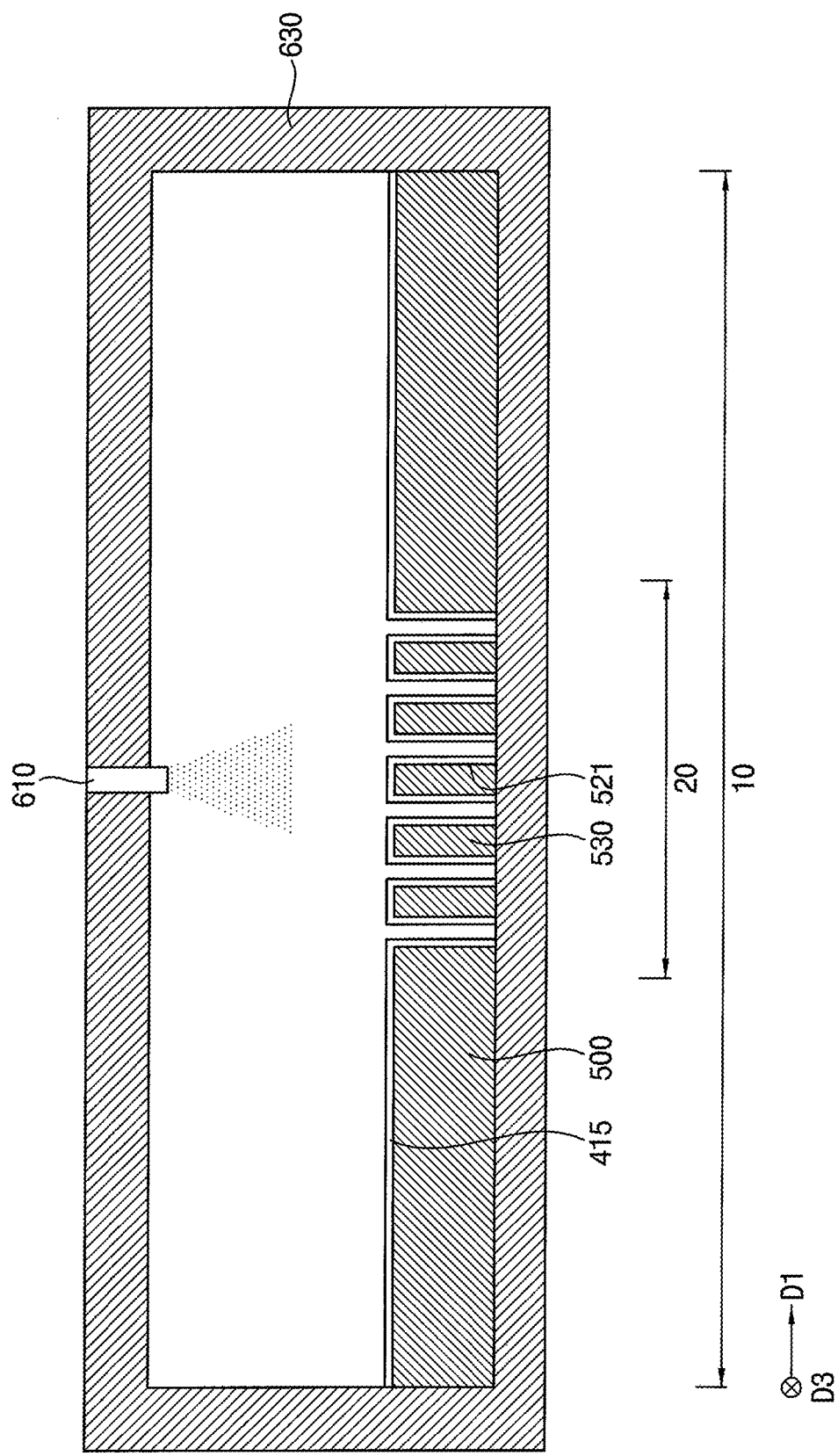

Referring to FIG. 10, the support member 500, on which the primer coating layer 415 is formed, may be positioned inside a mold 630. After the support member 500 formed thereon with the primer coating layer 415 is placed, a resin foam may be sprayed onto the primer coating layer 415 by using a nozzle 610.

In an embodiment, the resin foam may include at least one selected from a polyurethane foam, a polyurethane derivative resin foam, a urea foam, a urea derivative resin foam, a polyvinyl chloride foam, a polyvinyl chloride derivative resin foam, a polypropylene foam, a polypropylene derivative resin foam, a polystyrene foam, a polystyrene derivative resin foam, a polyethylene foam, a polyethylene derivative resin foam, a polyvinyl acetate foam, a polyvinyl acetate derivative resin foam, a melamine resin foam, a melamine derivative resin foam, a phenol resin foam and a phenol derivatives resin foam, for example. In an embodiment, the resin foam may be manufactured using a polyurethane foam.

Figure 11:
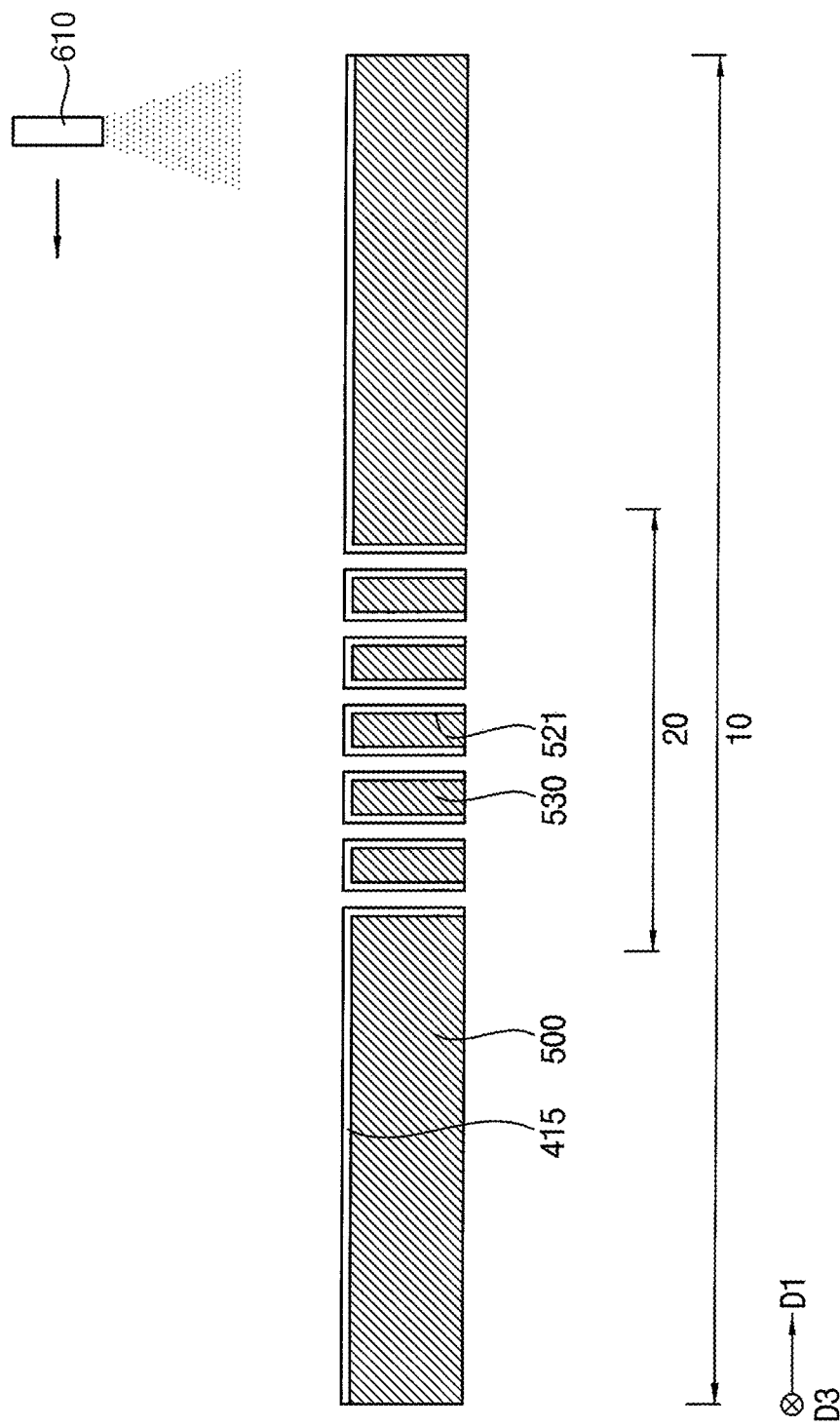

Referring to FIG. 11, in an alternative embodiment, the resin foam may be sprayed on the primer coating layer 415 while the nozzle 610 moves over the support member 500 on which the primer coating layer 415 is formed.

Figure 12:
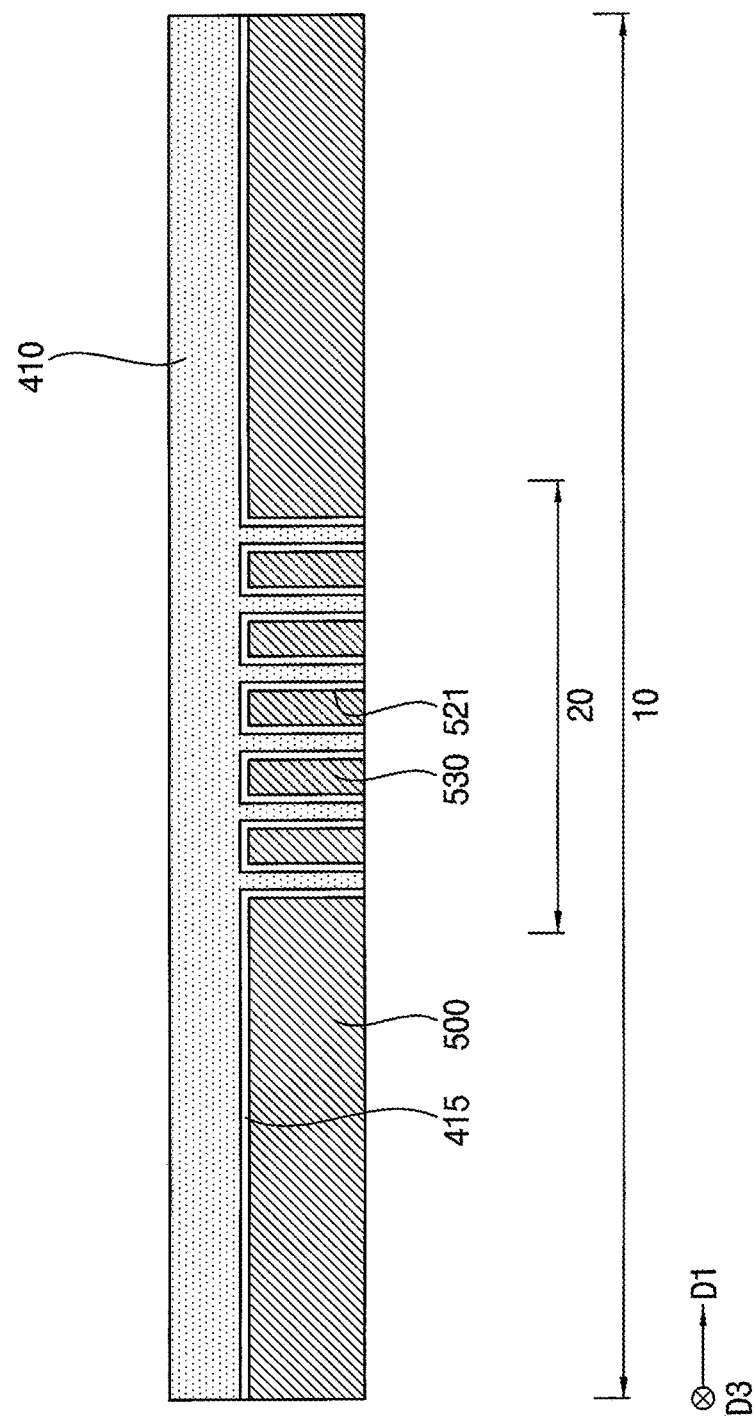
Figure 13:
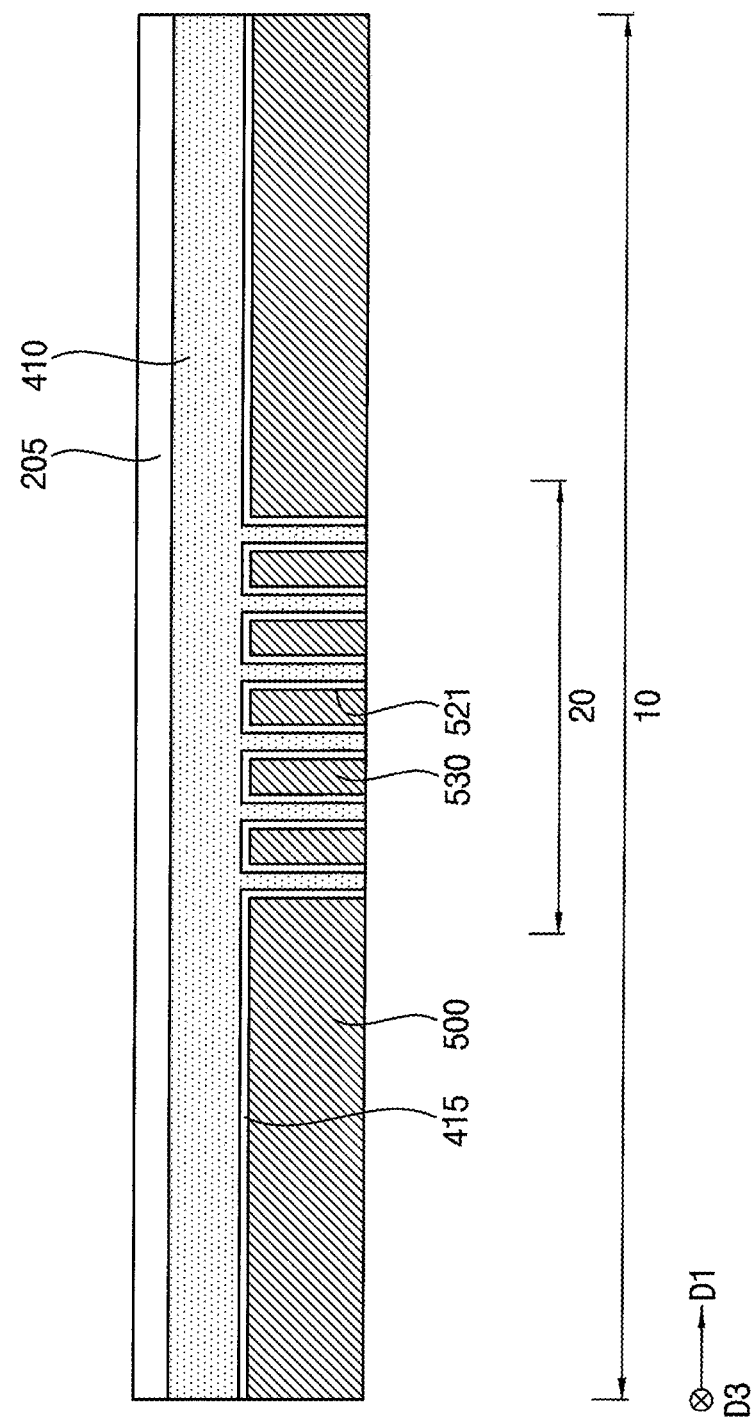

Referring to FIG. 12, after the resin foam is sprayed, the shock absorbing member 410 may be formed on the primer coating layer 415. In an embodiment, the shock absorbing member 410 may be formed in each of the openings 535, and may be in direct contact with the primer coating layer 415. In one embodiment, for example, the shock absorbing member 410 may be filled within the primer coating layer 415 formed on the side walls of the support member 500. In such an embodiment, the shock absorbing member 410 may be formed on the trenches 520 and the top surface of each of the protrusions 530, and the shock absorbing member 410 may be filled within the primer coating layer 415 formed on each side wall of the trenches 520. In an embodiment, where the resin foam is manufactured using polyurethane foam, the shock absorbing member 410 may include PU foam.

An adhesive member 205 may be provided or formed on the shock absorbing member 410. The adhesive member 205 may include at least one selected from OCA, PSA, photo-curable resin and thermosetting resin, for example. In an embodiment, for example, the adhesive may be manufactured using at least one selected from PET, PEN, PP, PC, PS, PSul, PE, PPA, PES, PAR, PCO, MPPO, and the like. The resin of the adhesive member 205 may be manufactured using epoxy resin, amino resin, phenol resin, urea resin, melamine resin, unsaturated polyester resin, polyurethane resin, polyimide resin, and the like.

Referring back to FIG. 4, the display panel 200 may be bonded to the adhesive member 205. Accordingly, the organic light emitting display device 100 shown in FIGS. 1 to 6 may be manufactured.

In a conventional method of manufacturing the organic light emitting display device 100, the shock absorbing member 410 may bonded to the support member 500 through an adhesive member. Further, in the process of attaching the adhesive member 205 onto the shock absorbing member 410 after the shock absorbing member 410 is bonded to the support member 500 through the adhesive member, the adhesive strength of the adhesive member, which has a relatively large molecular weight and a relatively thick thickness (for example, 25 angstroms or more), is relatively small. Accordingly, before the adhesive member 205 is attached to the shock absorbing member 410, a process of replacing a release paper of the adhesive member 205 (for example, a process of replacing a heavy liner with an easy liner) may be performed. When the adhesive member 205 is attached onto the shock absorbing member 410 without the process of replacing the release paper, the adhesive member or the shock absorbing member 410 may be delaminated from the support member 500 during removing the release paper attached onto the top surface of the adhesive member 205. Accordingly, when the process of replacing the release paper is performed, manufacturing process steps may be increased, and manufacturing costs may also be increased.

In an embodiment of the method of manufacturing the organic light emitting display device 100 according to the invention, the primer coating layer 415 instead of the adhesive member is formed on the support member 500, so that the adhesive strength between the support member 500 and the shock absorbing member 410 may be relatively increased. Accordingly, the adhesive member 205 may be effectively attached onto the shock absorbing member 410 without the process of replacing the release paper. Thus, the manufacturing process steps of the organic light emitting display device 100 may be reduced, and the manufacturing costs of the organic light emitting display device 100 may be reduced.

Figure 14:
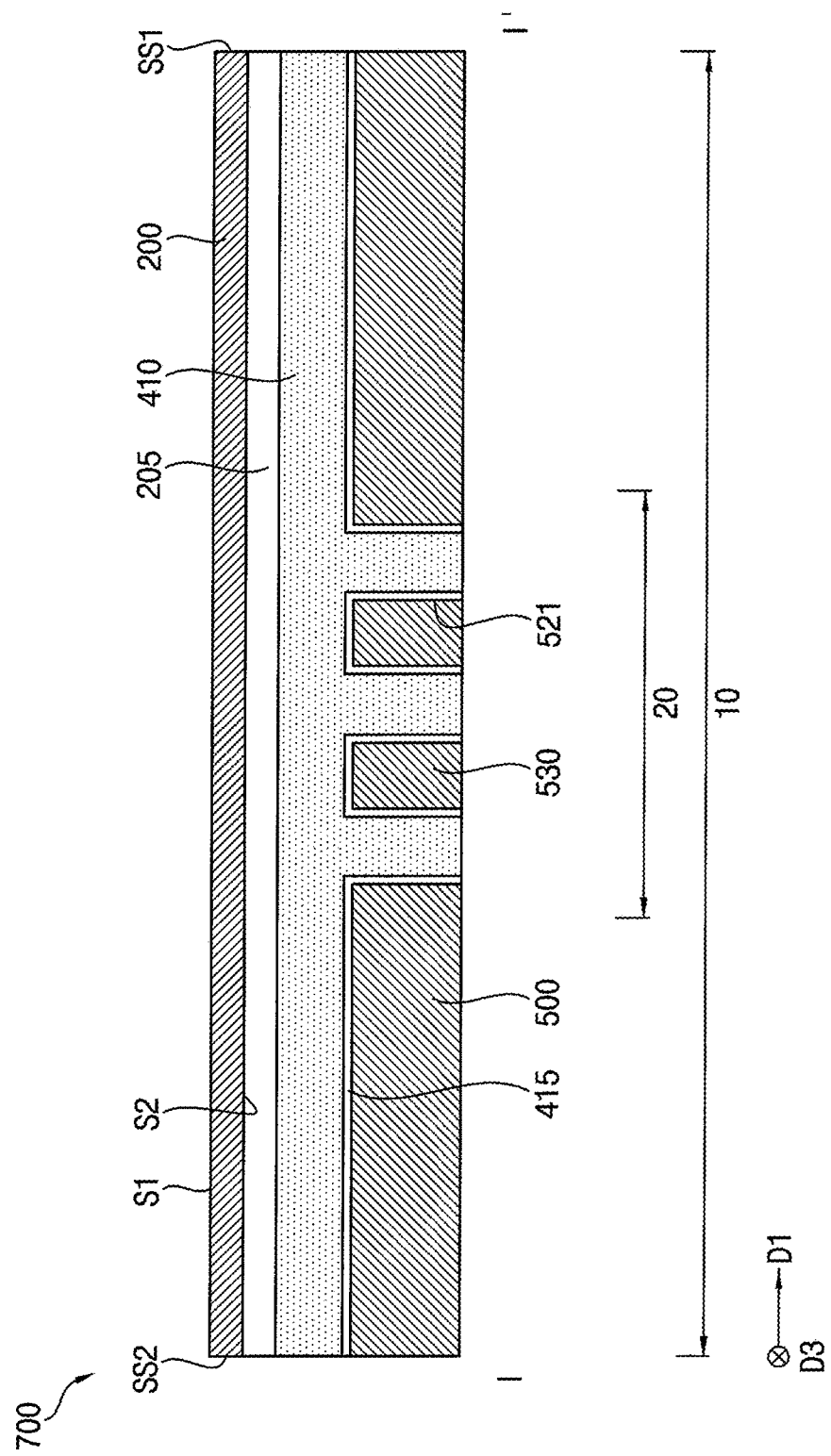
FIG. 14 is a cross-sectional view showing the organic light emitting display device according to an alternative embodiment of the invention.

FIG. 14 is a sectional view showing the organic light emitting display device according to an alternative embodiment of the invention.

The organic light emitting display device 700 illustrated in FIG. 14 may have substantially the same or similar configuration as the organic light emitting display device 100 described above with reference to FIGS. 1 to 6, except for a shape of the support member 500. The same or like elements shown in FIG. 14 have been labeled with the same reference characters as used above to describe the embodiments of the organic light emitting display device 100 shown in FIGS. 1 to 6, and any repetitive detailed description thereof will hereinafter be omitted or simplified.

Referring to FIG. 14, an embodiment of the organic light emitting display device 700 may include a display panel 200, an adhesive member 205, a shock absorbing member 410, a primer coating layer 415, a support member 500, and the like. The organic light emitting display device 700 may include a display area 10 and a foldable area 20. The display area 10 is an area where an image is displayed from the display panel 200, and the foldable area 20 is an area in which the organic light emitting display device 700 is folded or unfolded. A part of the display area 10 may define the foldable area 20. In such an embodiment, the image may also be displayed in the foldable area 20. In an embodiment, as shown in FIGS. 2 and 5, a plurality of openings 535, a plurality of protrusions 530, and a plurality of trenches 520 may be defined or formed in the support member 500. In such an embodiment, the width of the foldable area 20 in the first direction D1 may be substantially narrower than those shown in FIG. 14. In the drawings, the width is shown relatively wide for convenience of illustration and description.

The support member 500 may be disposed on a bottom surface of the display panel 200. In an embodiment, the support member 500 may be disposed on the second surface S2 of the display panel 200, and a plurality of openings 535 may be defined or formed through the support member 500 on the foldable area 20. In an embodiment, the openings 535 may include openings 531 arranged in the first direction D1 and openings 532 shifted in a second direction D2 orthogonal to the first direction D1 and arranged in the first direction D1. In an embodiment, the support member 500 may further include a plurality of protrusions 530 protruding in the third direction D3. In an embodiment, a space between two adjacent protrusions among the protrusions 530 may define a trench 520.

In an embodiment, as shown in FIG. 14, the number of openings 535 and/or the number of trenches 520 formed in the support member 500 of FIG. 14 may be relatively small, and each width of the openings 535, each width of the protrusions 530, and each width of the trenches 520 may be relatively large, when compared with the embodiments shown in FIG. 4. In a case where a precision etching process is performed to form the openings 535 and the trenches 520 having relatively small widths in the support member 500 of the organic light emitting display device 100, the yield may be reduced due to the precise etching process.

In an embodiment of the organic light emitting display device 700 according to the invention, the shock absorbing member 410 may be filled in the openings 535 and the trenches 520, so that deformations of the openings 535 and trenches 520 may be effectively prevented from exceeding an elastic limit. Accordingly, each width of the openings 535, each width of the protrusions 530, and each width of the trenches 520 may be manufactured to be relatively large, and the precision etching process may not be performed.

Figure 15:
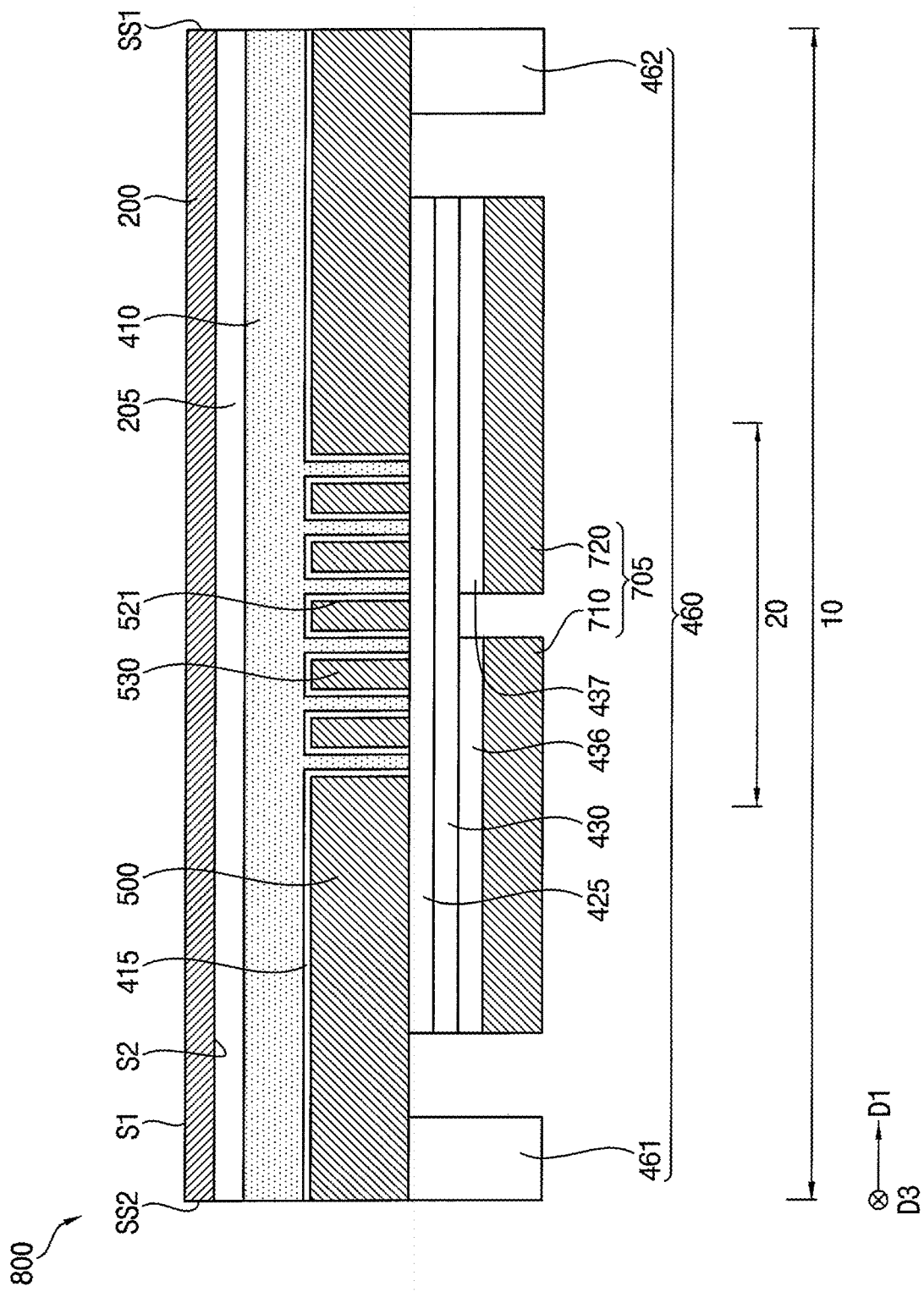
FIG. 15 is a cross-sectional view showing the organic light emitting display device according to another alternative embodiment of the invention.

FIG. 15 is a cross-sectional view showing the organic light emitting display device according to another alternative embodiment of the invention.

The organic light emitting display device 800 illustrated in FIG. 15 may have substantially the same or similar configuration as the organic light emitting display device 100 described with reference to FIGS. 1 to 6, except for a second adhesive member 425, a third adhesive member 436, a fourth adhesive member 437, an elastic member 430, a step compensation member 460, and a metal member 705. The same or like elements shown in FIG. 15 have been labeled with the same reference characters as used above to describe the embodiments of the organic light emitting display device 100 shown in FIGS. 1 to 6, and any repetitive detailed description thereof will hereinafter be omitted or simplified.

Referring to FIG. 15, an embodiment of the organic light emitting display device 800 may include a display panel 200, a first adhesive member 205, a shock absorbing member 410, a primer coating layer 415, a support member 500, a second adhesive member 425, a third adhesive member 436, a fourth adhesive member 437, an elastic member 430, a step compensation member 460, a metal member 705, and the like. The organic light emitting display device 800 may include a display area 10 and a foldable area 20. In such an embodiment, as shown in FIGS. 2 and 5, a plurality of openings 535, a plurality of protrusions 530, and a plurality of trenches 520 may be defined or formed in the support member 500. In such an embodiment, as shown in FIG. 15, the step compensation member 460 may include a first step compensation member 461 and a second step compensation member 462. The metal member 705 may include a first metal member 710 and a second metal member 720.

The elastic member 430 may be disposed on a part of the bottom surface of the support member 500. In an embodiment, the elastic member 430 may be disposed to overlap the openings 535 and the trenches 520 on the foldable area 20 on the bottom surface of the support member 500. While the organic light emitting display device 800 is repeatedly folded and unfolded, the elastic member 430 may be stretched and contracted. The elastic member 430 may include elastomer having a relatively large elastic force or relatively large restoring force. In one embodiment, for example, the elastic member 430 may include an elastic material such as silicone, urethane, and thermoplastic polyurethane ("TPU").

The second adhesive member 425 may be disposed between the support member 500 and the elastic member 430. In an embodiment, a top surface of the second adhesive member 425 may be in direct contact with the primer coating layer 415, the shock absorbing member 410 and the bottom surface of the support member 500, and a bottom surface of the second adhesive member 425 may be in direct contact with the top surface of the elastic member 430. In such an embodiment, the second adhesive member 425 may cover the openings 535. The second adhesive member 425 may bond the elastic member 430 onto the bottom surface of the support member 500. In such an embodiment, while the organic light emitting display device 800 is repeatedly folded and unfolded, the second adhesive member 425 may be stretched and contracted. The second adhesive member 425 may include at least one selected from OCA, PSA, photo-curable resin and thermosetting resin, for example. In one embodiment, for example, the adhesive may include at least one selected from PET, PEN, PP, PC, PS, PSul, PE, PPA, PES, PAR, PCO and MPPO. The resin of the second adhesive member 425 may include at least one selected from epoxy resin, amino resin, phenol resin, urea resin, melamine resin, unsaturated polyester resin, polyurethane resin and polyimide resin, for example.

The metal member 705 may be disposed on the bottom surface of the elastic member 430. In one embodiment, for example, the first metal member 710 may be disposed on a first portion of the bottom surface of the elastic member 430, and the second metal member 720 may be disposed on a second portion on the bottom surface of the elastic member 430. Each of the first and second portions of the elastic member 430 may partially overlap the foldable area 20. In an embodiment, the first metal member 710 and the second metal member 720 may be spaced apart from each other in the first direction D1. The spaced distance may be determined based on the radius of curvature of the foldable area 20. In an embodiment, the metal member 705 may prevent the display panel 200 from sagging in the foldable area 20, and may serve to shield static electricity, electromagnetic waves, electric fields, magnetic fields, and the like, which may be generated from the outside. In an embodiment, the metal member 705 may include SUS. Alternatively, the metal member 705 may include at least one selected from Au, Ag, Al, W, Cu, Pt, Ni, Ti, Pd, Mg, Ca, Li, Cr, Ta, Mo, Sc, Nd, Ir, an alloy containing aluminum, AlN, an alloy containing silver, WN, an alloy containing copper, an alloy containing molybdenum, TiN, CrN, TaN, SrRuO, ZnO, ITO, SnO, InO, GaO and IZO, for example. These materials may be used individually or in combination. In an alternative embodiment, a step compensation member and an adhesive member may be additionally disposed on the bottom surface of the metal member 705. The adhesive member may be in contact with a set member surrounding the organic light emitting display device 800, and the step compensation member together with the metal member 705 may prevent the display panel 200 from sagging in the foldable area 20.

The third adhesive member 436 may be disposed between the first metal member 710 and the elastic member 430. In an embodiment, a top surface of the third adhesive member 436 may be in direct contact with the elastic member 430, and a bottom surface of the third adhesive member 436 may be in direct contact with the first metal member 710. The third adhesive member 436 may bond the first metal member 710 to the first portion on the bottom surface of the elastic member 430. The fourth adhesive member 437 may be disposed between the second metal member 720 and the elastic member 430. In an embodiment, a top surface of the fourth adhesive member 437 may be in direct contact with the elastic member 430, and a bottom surface of the fourth adhesive member 437 may be in direct contact with the second metal member 720. In an embodiment, the third adhesive member 436 and the fourth adhesive member 437 may be spaced apart from each other in the first direction D1. The fourth adhesive member 437 may bond the second metal member 720 to the second portion on the bottom surface of the elastic member 430. Each of the third adhesive member 436 and the fourth adhesive member 437 may include at least one selected from OCA, PSA, photo-curable resin and thermosetting resin, for example.

The step compensation member 460 may be spaced apart from the second adhesive member 425, the elastic member 430, the third adhesive member 436, the fourth adhesive member 437, and the metal member 705 on the bottom surface of the support member 500. In one embodiment, for example, the first step compensation member 461 may be disposed on a first portion of the bottom surface of the support member 500, and the second step compensation member 462 may be disposed on a second portion on the bottom surface of the support member 500. In an embodiment, the bottom surface of the step compensation member 460 and the bottom surface of the metal member 705 may be positioned at a same level as each other or on a same plane. The step compensation member 460 may prevent the display panel 200 from sagging in a portion where the metal member 705 is not disposed. The step compensation member 460 may include at least one selected from PET, PEN, PP, PC, PS, PSul, PE, PPA, PES, PAR, PCO and MPPO, for example. In an embodiment, an adhesive member may be additionally disposed on the bottom surface of the step compensation member 460. The adhesive member may be in contact with the set member surrounding the organic light emitting display device 800.

An embodiment of the organic light emitting display device 800 according to the invention may include the metal member 705, so that the display panel 200 may be prevented from sagging in the foldable area 20, and static electricity, electromagnetic waves, electric fields, magnetic fields, and the like generated from the outside may be shielded.

Embodiments of the invention may be applied to various electronic devices including an organic light emitting display device, e.g., vehicle-display device, a ship-display device, an aircraft-display device, portable communication devices, display devices for display or for information transfer, a medical-display device, etc.

The invention should not be construed as being limited to the embodiments set forth herein. Rather, these exemplary embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An organic light emitting display device comprising:
   a display panel including a foldable area;
   a support layer disposed on a bottom surface of the display panel, wherein a plurality of openings is defined through the support layer on the foldable area;
   a coating layer disposed on a top surface of the support layer and side walls of the support layer which define the openings; and
   a cushion layer disposed between the coating layer and the display panel.

2. The organic light emitting display device of claim 1, wherein
   the cushion layer is disposed in each of the openings, and
   the cushion layer is in direct contact with the coating layer.

3. The organic light emitting display device of claim 1, wherein the cushion layer is filled within the coating layer disposed on the side walls of the support layer.

4. The organic light emitting display device of claim 1, wherein the cushion layer includes a polyurethane foam.

5. The organic light emitting display device of claim 1, wherein the coating layer includes polyisocyanate and polyol.

6. The organic light emitting display device of claim 1, wherein the coating layer has a thickness smaller than a thickness of the cushion layer.

7. The organic light emitting display device of claim 1, further comprising:
a first adhesive member disposed between the display panel and the cushion layer.

8. The organic light emitting display device of claim 7, wherein
a top surface of the first adhesive member is in direct contact with the bottom surface of the display panel, and
a bottom surface of the first adhesive member is in direct contact with a top surface of the cushion layer.

9. The organic light emitting display device of claim 1, wherein
the display panel further includes a display area, and
the foldable area is defined by a part of the display area.

10. The organic light emitting display device of claim 1, wherein
the openings of the support layer include $1^{st}$ to $n^{th}$ openings arranged in a first direction parallel to a top surface of the display panel, wherein n is an integer of 1 or greater, and
a $k^{th}$ opening among the Pt to $n^{th}$ openings is positioned while being shifted in a second direction orthogonal to the first direction, wherein k is an even number between 1 and n.

11. The organic light emitting display device of claim 10, wherein
the support layer further includes a plurality of protrusions, each positioned in a third direction opposite to the second direction of corresponding two adjacent openings among the $1^{st}$ to $n^{th}$ openings, and
the coating layer is disposed on a top surface of each of the protrusions.

12. The organic light emitting display device of claim 11, wherein
a trench is defined by a space between two adjacent protrusions among the protrusions, and
the coating layer is disposed on a side wall of the trench.

13. The organic light emitting display device of claim 1, further comprising:
a first step compensation member disposed on a first portion of a bottom surface of the support layer; and
a second step compensation member disposed on a second portion opposite to the first portion of the bottom surface of the support layer.

14. The organic light emitting display device of claim 1, further comprising:
an elastic member disposed on a bottom surface of the support layer; and
a second adhesive member disposed between the support layer and the elastic member.

15. The organic light emitting display device of claim 14, wherein
the second adhesive member is in direct contact with the bottom surface of the support layer and a top surface of the elastic member, and
the second adhesive member covers the openings.

16. The organic light emitting display device of claim 14, wherein the coating layer and the cushion layer disposed in the openings are in direct contact with the second adhesive member.

17. The organic light emitting display device of claim 14, further comprising:
a first metal member disposed on a first portion of a bottom surface of the elastic member; and
a second metal member disposed on a second portion opposite to the first portion of the bottom surface of the elastic member,
wherein the second metal member is spaced apart from the first metal member.

18. The organic light emitting display device of claim 17, wherein each of the first portion and the second portion partially overlaps the foldable area.

19. The organic light emitting display device of claim 17, further comprising:
a third adhesive member disposed between the first metal member and the elastic member; and
a fourth adhesive member disposed between the second metal member and the elastic member,
wherein the fourth adhesive member is spaced apart from the third adhesive member.

20. The organic light emitting display device of claim 1, wherein
the display panel includes a first side surface and a second side surface opposite to the first side surface, and
the first side surface and the second side surface of the display panel are positioned adjacent to each other when the foldable area is folded.

* * * * *